(12) United States Patent
Tan et al.

(10) Patent No.: US 9,098,486 B1
(45) Date of Patent: Aug. 4, 2015

(54) METHODS AND APPARATUS FOR TESTING MULTIPLE CLOCK DOMAIN MEMORIES

(71) Applicant: Altera Corporation, San Jose, CA (US)

(72) Inventors: Tze Sin Tan, Pulau Pinang (MY); Chin Hai Ang, Pulau Pinang (MY)

(73) Assignee: Altera Corporation, San Jose, CA (US)

( * ) Notice: Subject to any disclaimer, the term of this patent is extended or adjusted under 35 U.S.C. 154(b) by 196 days.

(21) Appl. No.: 13/826,328

(22) Filed: Mar. 14, 2013

(51) Int. Cl.
*G06F 11/00* (2006.01)
*G06F 11/27* (2006.01)
*G01R 31/3177* (2006.01)
*G06F 11/22* (2006.01)

(52) U.S. Cl.
CPC ............ *G06F 11/27* (2013.01); *G01R 31/3177* (2013.01); *G06F 11/2205* (2013.01)

(58) Field of Classification Search
CPC .. G06F 11/2205; G06F 11/27; G01R 31/3177
USPC ............................................... 714/30, 32, 34
See application file for complete search history.

(56) References Cited

U.S. PATENT DOCUMENTS

| | | | |
|---|---|---|---|
| 6,373,312 B1 * | 4/2002 | Barnes et al. ................. | 327/261 |
| 6,904,553 B1 * | 6/2005 | Brown .......................... | 714/731 |
| 6,978,411 B2 * | 12/2005 | Huang et al. ................. | 714/733 |
| 7,194,669 B2 | 3/2007 | Nadeau-Dostie | |
| 7,424,656 B2 * | 9/2008 | Nadeau-Dostie et al. .... | 714/731 |
| 7,707,472 B1 | 4/2010 | Dastidar | |
| 7,734,966 B1 * | 6/2010 | Lee et al. ...................... | 714/718 |
| 7,984,344 B1 | 7/2011 | Ang et al. | |
| 7,996,743 B1 | 8/2011 | Tan et al. | |
| 8,117,580 B1 | 2/2012 | Trimberger | |
| 8,259,522 B1 | 9/2012 | Dastidar et al. | |
| 2008/0059850 A1 * | 3/2008 | Bahl ............................. | 714/718 |
| 2008/0313589 A1 * | 12/2008 | Maixner et al. .................. | 716/6 |

* cited by examiner

*Primary Examiner* — Joshua P Lottich
(74) *Attorney, Agent, or Firm* — Kwan & Olynick LLP

(57) ABSTRACT

An integrated circuit device has first and memory that use first and second normal mode clocks with differing clock domains. A first switching circuit selectively outputs to the first memory the first normal mode clock when the normal mode is selected or the initial test clock as a first test clock when a testing mode is selected, and a second switching circuit selectively outputs to the second memory the second normal mode clock when the normal mode is selected or the test clock as a second test clock when the testing mode is selected. A built-in-self-test switching circuit receives and outputs the first test clock when the first memory is being tested or the second test clock when the second memory is being tested, and a built-in-self-test circuit receives and uses the first test clock for testing the first memory or the second test clock for testing the second memory.

18 Claims, 12 Drawing Sheets

METHODS AND APPARATUS FOR TESTING MULTIPLE CLOCK DOMAIN MEMORIES

TECHNICAL FIELD OF THE INVENTION

This invention relates generally to testing memory in programmable devices. More specifically, this invention relates to testing memory using built-in-self-testing (BIST) mechanisms.

BACKGROUND

Memory blocks are often fabricated as part of modern integrated circuits. For example, application-specific integrated circuits and programmable integrated circuits such as programmable logic device integrated circuits may contain memory blocks. Memory blocks may be provided in the form of arrays of random-access memory (RAM) cells. The memory blocks are used to handle the storage needs of the circuitry on a given integrated circuit. During normal operation of the integrated circuit, read and write operations are performed on the memory blocks.

To ensure satisfactory operation of an integrated circuit that contains memory blocks, the memory blocks are generally tested during debug and design operations. Testing may also be performed during manufacturing. It can be cumbersome or impossible to perform high-speed memory tests using only external test equipment. It is therefore often desirable to include internal test support circuitry on an integrated circuit to facilitate memory block tests. Because the internal test circuitry is incorporated into the integrated circuit that is to be tested, this type of test circuitry is sometimes referred to as built-in-self-test (BIST) circuitry.

A BIST circuit supplies a memory block with test data while systematically stepping through the addresses for the memory block. If an unexpected result is detected in response to certain test data, the BIST circuitry can conclude that the memory block contains an error. Appropriate debugging or manufacturing repair operations may then be performed. Conventional BIST architectures are satisfactory in certain situations, but can be inefficient or ineffective in other situations.

Accordingly, there is a continuing need to provide enhanced memory block built-in-self-test circuitry for testing memory blocks on an integrated circuit.

SUMMARY OF THE INVENTION

The following presents a simplified summary of the disclosure in order to provide a basic understanding of certain embodiments of the invention. This summary is not an extensive overview of the disclosure, and this summary does not identify key/critical elements of the invention or delineate the scope of the invention. Its sole purpose is to present some concepts disclosed herein in a simplified form as a prelude to the more detailed description that is presented later.

In one embodiment, an integrated circuit device is disclosed. The device comprises a first memory that is operable to use a first normal mode clock having a first clock domain characteristic for a normal mode and a second memory that is operable to use a second normal mode clock having a second clock domain characteristic for the normal mode, and the first clock domain characteristic differs from the second clock domain characteristic. The device further includes a first switching circuit that is arranged to receive the first normal mode clock and an initial test clock and to selectively output to the first memory either the first normal mode clock when the normal mode is selected or the initial test clock as a first test clock when a testing mode is selected and a second switching circuit that is arranged to receive the second normal mode clock and the initial test clock and to selectively output to the second memory either the second normal mode clock when the normal mode is selected or the test clock as a second test clock when the testing mode is selected. The device also comprises a built-in-self-test (BIST) switching circuit that is arranged to receive and output the first test clock when the first memory is being tested and to receive and output the second test clock when the second memory is being tested and a built-in-self-test (BIST) circuit that is arranged to receive and use the first test clock for testing the first memory and to receive and use the second test clock for testing the second memory.

In a specific implementation, the BIST switching circuit is arranged so that a first delay associated with a first path between an output of the first switch circuit and the BIST circuit equals a delay associated with a second path between the output of the first switch circuit and the first memory so as to cause the first test clock to be aligned when received into the BIST circuit and the first memory, and a second delay associated with a first path between the output of the second switch circuit and the BIST circuit equals a delay associated with a second path between the output of the second switch circuit and the second memory so as to cause the second test clock to be aligned when received into the BIST circuit and the second memory. In another example, device includes a first delay circuit arranged to compensate for more delay being present in a first routing path between the output of the first switch circuit and the BIST circuit than in a second routing path between the output of the first switch circuit and the first memory and a second delay circuit arranged to compensate for more delay being present in a first routing path between the output of the second switch circuit and the BIST circuit than in a second routing path between the output of the second switch circuit and the second memory. In this aspect, the first delay circuit is arranged to cause the first test clock to be aligned when received into the BIST and the first memory and the second delay is arranged to cause the second test clock to be aligned when received into the BIST circuit and the second memory.

In another implementation, the BIST circuit is arranged to use a same timing for testing the first memory as the timing for the first test clock that is received by the first memory during such testing of the first memory and the BIST circuit is arranged to use a same timing for testing the second memory as the timing for the second test clock that is received by the second memory during such testing of the second memory. In a further aspect, the device includes one or more delay circuits that are arranged to delay the test clock that is input to the first and second switching circuits during an automatic test pattern generation (ATPG) mode, and the BIST switch circuit is arranged to decouple a timing of the first and second test clocks from such one or more delay circuits during testing of the first or second memory by the BIST circuit during a BIST mode. In yet a further aspect, the one or more delay circuits comprise a first delay circuit arranged to delay the test clock that is input to the first switching circuit and does not comprise a delay circuit for delaying the test clock that is input to the second switching circuit.

In another embodiment, the device has a clock selection circuit associated with the BIST circuit for generating a plurality of clock selection values for inputting to the BIST switching circuit, and the BIST switching circuit is arranged to receive one of the clock selection values as one or more inputs for selecting between the first and second test clock. In a further aspect, the clock selection circuit comprises a plurality of scan registers for receiving input data for testing the first and second memory along with clock selection data for generating the plurality of inputs for selecting between the first and second test clock.

In an alternative embodiment, the invention pertains to an integrated system on a chip (SOC). The SOC includes a plurality of memory arrays that are operable in a plurality of different clock domains corresponding to a plurality of different user mode clocks, and one or more of the memory arrays are operable in each different clock domain. The different user mode clocks are receivable by their corresponding one or more memory arrays via a plurality of user mode paths having a plurality of associated delays. The SOC also includes a plurality of programmed logic modules for implementing one or more functions, and one or more programmed logic modules are operable in each different clock domains. The SOC also includes a built-in-self-test (BIST) module for testing each of the memory arrays using a test clock and a clock selector arranged to select one of a plurality of selectable paths for the BIST module to receive the test clock for testing each memory array. The selected path has a delay that is substantially equal to such memory array's associated delay of its user mode path. In a further aspect, the BIST module is arranged to use a same timing for testing each memory as the timing for the test clock that is received by such memory during such testing of such memory. In another embodiment, a method of implementing or operating any of the above devices is disclosed.

These and other features of the present invention will be presented in more detail in the following specification of certain embodiments of the invention and the accompanying figures which illustrate by way of example the principles of the invention.

DETAILED DESCRIPTION OF THE SPECIFIC EMBODIMENTS

Figure 1:
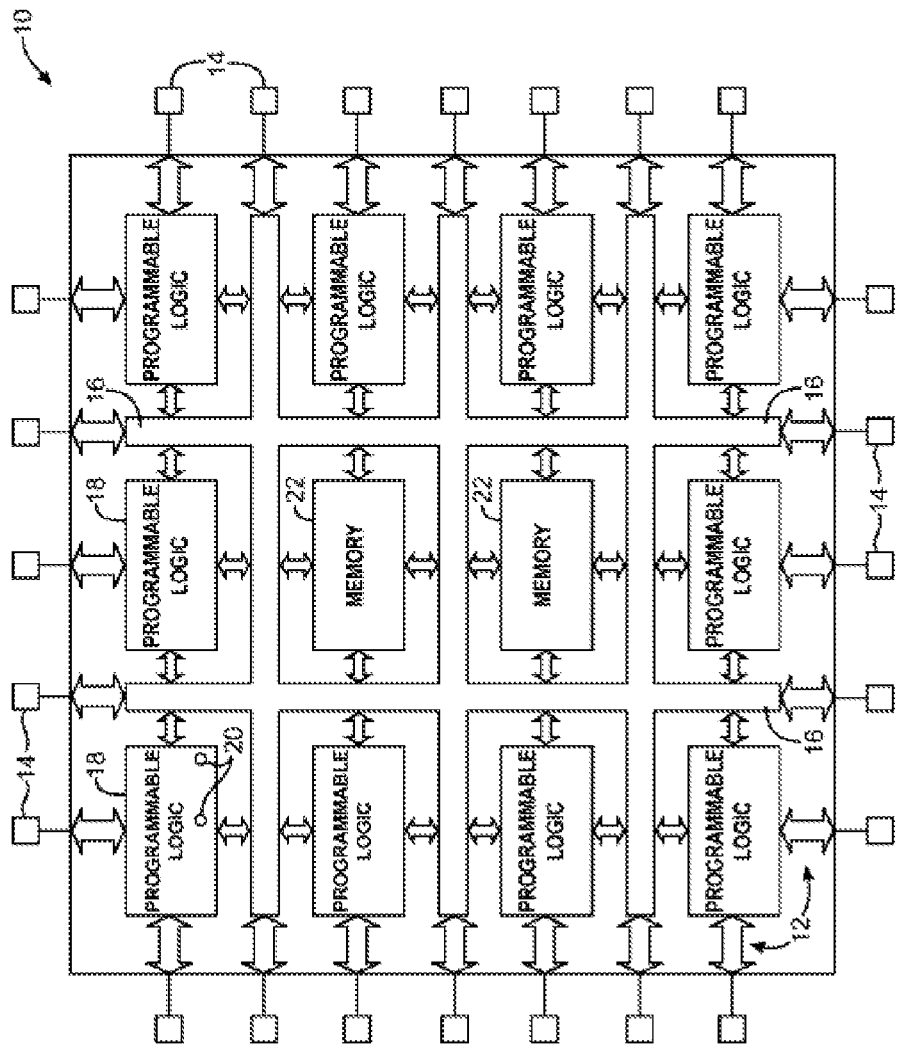
FIG. 1 is a diagrammatic representation of an integrated circuit, such as a programmable integrated circuit, that may be tested using techniques and apparatus of the present invention.

In the following description, numerous specific details are set forth in order to provide a thorough understanding of the present invention. The present invention may be practiced without some or all of these specific details. In other instances, well known process operations have not been described in detail so as to not obscure the present invention. While the invention will be described in conjunction with the specific embodiments, such specific description is not intended to limit the invention to these embodiments.

The present invention relates to testing integrated circuits that have built-in-self-test (BIST) circuitry that interfaces to different memory that have been designed to operate in different clock domains. For instance, different clock domains may implement different frequencies, phases, etc. The BIST be configured to test such different memory, as well as other circuitry such as logic circuits, or any other suitable circuitry on an integrated circuit. Prior to describing detailed BIST arrangements, example circuits in which BIST circuits may be implemented will first be generally described.

Devices that include one or more BIST modules may take any suitable form, such as application specific integrated circuits, electrically programmable and mask-programmable logic device integrated circuits, digital signal processors, microprocessors, microcontrollers, and memory chips. If desired, the testing circuitry of the present invention may be used in programmable integrated circuits that are not traditionally referred to as programmable logic devices such as microprocessors containing programmable logic, digital signal processors containing programmable logic, custom integrated circuits containing regions of programmable logic, or other programmable integrated circuits that contain programmable logic.

Embodiments of the present invention are described herein in connection with various specific devices, circuits, applications, etc. However, these references are for purposes of illustration only and are not intended to limit the present invention in any way. For example, one or more embodiments of the present invention will be explained using programmable logic devices (PLDs) and technologies related thereto to illustrate the present invention. However, the invention is widely applicable to other devices and in other environments. Moreover, embodiments of the present invention may be used in a wide variety of functions and/or applications.

Embodiments of the present invention may be utilized in relation to any device that includes memory devices or arrays. One example is a programmable logic device (PLD). PLD's are integrated circuits that can be configured by a user to perform custom logic functions. PLD's also generally contain a number of memory devices that can also be configured by a user to facilitate operation of custom logic circuitry. Although embodiments of the present invention may be used in the context of any integrated circuit that has circuitry that can be configured by a user to perform a custom function, certain embodiments of the present invention are described in the context of programmable logic devices for clarity.

An illustrative integrated circuit of the type that may contain testing circuitry for testing memory devices is shown in FIG. 1. As shown, integrated circuit 10 takes the form of a programmable logic device (PLD) integrated circuit having input/output circuitry 12 for driving signals off of device 10 and for receiving signals from other devices via input/output pins 14. Pins 14 may be any suitable types of pins or solder bumps for making electrical connections between the internal circuitry of device 10 and external packaging. Some of the pins 14 may be used for high-speed communications signals. Other pins may be used to provide power supply voltages to the device 10 or may be used for DC or low-frequency signals.

Interconnection resources 16, such as global and local vertical and horizontal conductive lines and busses, may be arranged to route signals on device 10. Interconnection resources 16 may include conductive lines and programmable connections between respective conductive lines and are, therefore, sometimes referred to as programmable interconnects 16.

Programmable logic device 10 may contain programmable logic 18 and memory blocks 22. The programmable logic device 10 may also include (not shown) regions of digital signal processing circuitry, processors, hardwired circuits for supporting complex communications and arithmetic functions, etc. Programmable logic 18 may also include may include combinational and sequential logic circuitry including logic gates, multiplexers, switches, memory blocks, look-up-tables, logic arrays, and sequential logic circuitry, etc. These illustrative components are not mutually exclusive. For example, look-up tables and other components that include logic gates and switching circuitry can be formed using multiplexers. The programmable logic 18 may be configured to perform one or more custom logic functions. The programmable interconnects 16 may be considered to be a type of programmable logic 18.

Some of the logic of programmable logic device is fixed (hardwired). The programmable logic in device 10 includes components that may be configured so that device 10 performs a desired custom logic function. The programmable logic in programmable logic device 10 may be based on any suitable programmable technology.

Programmable logic device 10 of FIG. 1 contains programmable memory elements 20, which can be loaded with configuration data (also called programming data) using pins 14 and input/output circuitry 12. Once loaded, the memory elements may each provide a corresponding static control output signal that controls the state of an associated logic component in programmable logic 18.

Memory elements 20 may use any suitable volatile and/or non-volatile memory structures such as random-access-memory (RAM) cells (e.g., CRAM or SRAM), fuses, anti-fuses, programmable read-only-memory memory cells, mask-programmed and laser-programmed structures, etc.

Configurable memory elements 20 can be loaded with configuration data during programming. Mask-programmed programmable logic devices, which are sometimes referred to as structured application specific integrated circuits, are programmed by using lithographic masks to create a custom pattern of connections in an array of vias based on configuration data.

Memory arrays 22 may contain rows and columns of volatile memory elements such as random-access-memory (RAM) cells. The memory arrays 22 can be used to store data signals during normal operation of device 10. The memory arrays 22 do not have to have the same size. For example, small, medium, and large memory arrays 22 may be included on the same programmable logic device. There memory arrays 22 may, for example, include hundreds of small memory arrays that each has a capacity of about 512 bits, 2-9 large memory arrays that each has a capacity of about half of a megabit, and an intermediate number of medium size memory arrays that each has a capacity of about 4 kilobits. These are merely illustrative memory array sizes and quantities. In general, there may be any suitable size and number of memory devices or arrays 22 on device 10. There may also be any suitable number of regions of programmable logic 18.

During user mode, memory elements 20 are generally loaded with configuration data from an external configuration device via pins 14 and input/output circuitry 12. The outputs of the loaded memory elements 20 are applied to the gates of metal-oxide-semiconductor transistors in programmable logic 18 to turn certain transistors on or off and thereby configure the logic in programmable logic 18. Programmable logic circuit elements that may be controlled in this way include pass transistors, parts of multiplexers (e.g., multiplexers used for forming routing paths in programmable interconnects 16), look-up tables, logic arrays, AND, OR, NAND, and NOR logic gates, etc.

The circuitry of device 10 may be organized using any suitable architecture. As an example, the logic of programmable logic device 10 may be organized in a series of rows and columns of larger programmable logic regions each of which contains multiple smaller logic regions. The resources of device 10, such as programmable logic 18 and memory 22, may be interconnected by programmable interconnects 16. Interconnects 16 generally include vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the logic of device 10 may be arranged in more levels or layers in which multiple large regions are interconnected to form still larger portions of logic. Still other device arrangements may use logic that is not arranged in rows and columns.

In addition to the relatively large blocks of programmable logic that are shown in FIG. 1, device 10 generally also includes some programmable logic associated with the programmable interconnects, memory, and input-output circuitry on device 10. For example, input-output circuitry 12 may contain programmable input and output buffers. Interconnects 16 may be programmed to route signals to a desired destination.

During certain types of testing, configuration data is generally loaded into memory elements 20 from a tester. Testers are typically based on dedicated test equipment. The test equipment may, for example, include one or more computers or other suitable computing equipment on which test software has been implemented. Testers may be used to load configuration data into memory elements 20 and, during testing, may be used to apply test vectors to device 10 while measuring test results. Additionally, the memory and/or other logic in the device 10 may be tested by BIST circuitry working in conjunction with an external testing device.

Integrated circuits such as programmable logic device 10 may include BIST circuitry for testing memory arrays such as memory arrays 22 of FIG. 1. The BIST circuitry may include clock receiving circuitry for receiving a test clock for use with the integrated circuit that is being tested. The test clock may be generated and controlled by an external tester. The BIST circuitry may supply the tester with test results. For example, the BIST circuitry may supply the tester with information on whether a memory device has failed or passed a read/write test or logic circuitry has failed or passed an operational test. This information may be used by the tester in analyzing the performance of the integrated circuit. If desired, the integrated circuit can be repaired or discarded based on the test results. For example, on a programmable logic device in which a defective circuit is identified, fuses or other nonvolatile memory elements can be programmed to switch redundant circuitry into use in place of the defective circuit, thereby repairing the integrated circuit. The integrated circuit may also be categorized based on the test results.

Testing may be performed when troubleshooting a new design or during manufacturing. The ability to perform detailed tests on circuitry such as programmable logic device circuits can be particularly helpful during early phases of product development. Detailed tests that include memory operation information can reveal design or process problems. By addressing these problems early during the development of a programmable logic device or other integrated circuit, the design of the device can be improved to reduce process sensitivity or the manufacturing process can be tuned to enhance manufacturing yields.

The BIST circuitry can be implemented using hardwired circuitry. If desired, some or all of the BIST circuitry can be constructed from programmable logic (e.g., when the BIST circuitry is being implemented on a programmable logic device). With arrangements of this type, in which the BIST circuitry is sometimes referred to as configurable BIST circuitry, the BIST circuitry may be implemented as part of the testing process. For example, the configurable BIST circuitry may be implemented by loading appropriate configuration data into programmable memory elements 20 on a given programmable logic device integrated circuit 10 in preparation for the subsequent loading of configuration data to configure a portion of the programmable logic device for testing. This type of BIST circuitry, which is sometimes referred to as soft BIST test circuitry or a soft BIST, temporarily consumes programmable logic resources. After testing is complete, the programmable logic resources can be used to implement a desired logic design for a user (e.g., to implement user logic). Soft BIST arrangements can be advantageous when it is desired to minimize the amount of hardwired circuitry on the device 10 that is dedicated to implementing BIST functions. Hardwired BIST arrangements can be advantageous in situations in which it is desirable to avoid the programming time associated with configuring a soft BIST.

Figure 2:
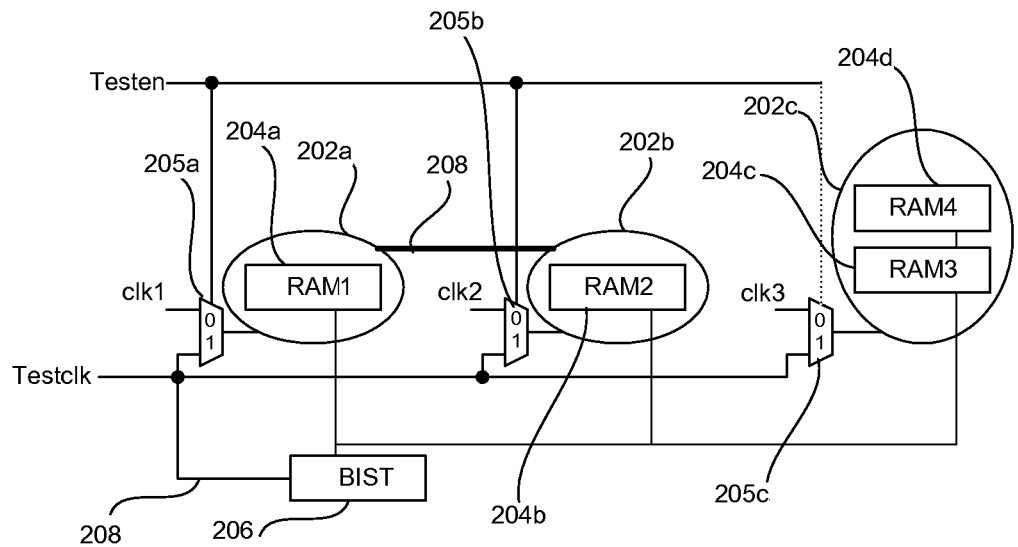
FIG. 2 is a diagrammatic representation of a system that uses a single test clock to test memory from different clock domains.

A single BIST may be used to test the functionality of multiple memory components that are designed to operate in different clock domains. However, some BIST systems may have associated timing issues from testing memory devices within different clock domains. FIG. 2 is a diagrammatic representation of a system that uses a single test clock to test memory from different clock domains and may also have associated timing issues. As shown, a first RAM (random access memory) 204a operates in a first clock domain 202a using clock Clk1, and a second RAM 204b operates in a second clock domain 202b using clock Clk2. Any number and type of memory devices may operate in each clock domain. For instance, more than one memory may operate in a single clock domain. As shown, RAM 204c and RAM 204d operate in clock domain 202c using clock Clk3.

Each RAM domain receives a particular clock input (e.g., Clk1, Clk2, or Clk3) during normal or user mode operation via an associated switching mechanism. For instance, RAM 204a receives Clk1 via MUX (multiplexer) 205a and RAM 204b receives Clk2 via MUX 205b when signal Testen is set to 0. Likewise, RAM 204c and 204d receive Clk3 via MUX 205c when signal Testen is set to 0.

During BIST testing, each of RAM 204a~204d receives a test clock Testclk 208 via their respective MUX's 205a~205c when signal Testen is set to 1. The BIST circuitry 206 also receives this single test clock Testclk 208 during testing.

Figure 3:
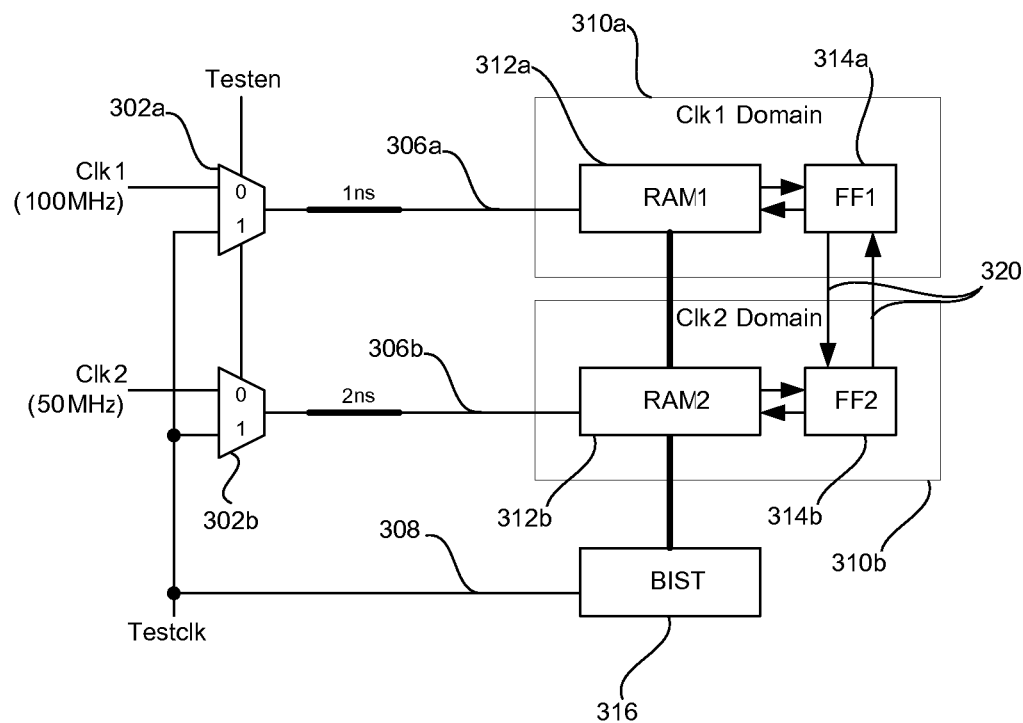
FIG. 3 illustrates a simple BIST system design for testing two memory devices from two different clock domains.

A BIST arrangement for testing memories from multiple clock domains using a single test clock may have associated timing issues. FIG. 3 will be used to illustrate these issues. FIG. 3 illustrates a simple BIST system design for testing two memory devices from two different clock domains. As shown, a particular design may include a first RAM 312a in a first clock domain 210a and a second RAM 312b in a second clock domain 310b. Each memory RAM 312a and 312b may also be accessible by other logic blocks of the design, such as FF1 314a and FF2 314b, respectively, which operate in the same clock domains as their respective memory devices.

In order to test two different RAMs (e.g., RAM 312a and RAM 312b), a single Testclk signal can be input through MUX 302a or 302b for RAM 312a or RAM 312b, respectively. For instance, when Testen is active or "1", MUX 302a and 302b pass Testclk signal to their respective RAM 302a and 302b. Otherwise, RAM 312a receives user mode clock "Clk1" via MUX 302a and RAM 312b receives user mode clock "Clk2" via MUX 302b, when testing is disabled (e.g., Testen=0). This Testclk signal also is received by BIST 316 (e.g., via line 308) when Testen is active or "1."

The clock lines between each MUX and respective RAM may have significantly different delays. For example, clock line 306a has a 1 ns delay, while clock line 306b has a 2 ns delay. These different delays may cause problems during BIST testing if mechanisms are not implemented to alleviate such problems.

Figure 4A:
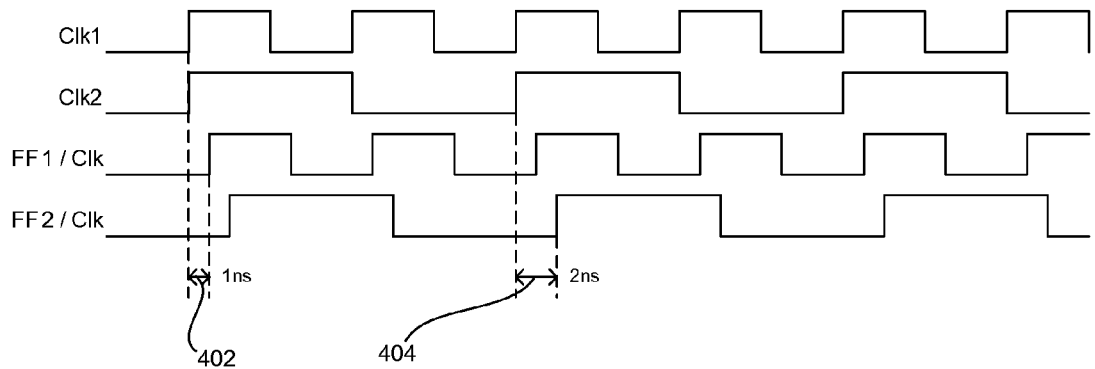
FIG. 4A is a timing diagram for user mode operation of the single clock BIST system of FIG. 3.

FIG. 4A is a timing diagram for user mode operation of the single clock BIST system of FIG. 3. In this example, clk1 is double the frequency of clk2. As shown, there is a 1 ns delay between the initial clk1 that was input into MUX 302a and the clock that is eventually received by the FF1 circuitry via the clock routing lines, such as line 306a. In contrast, there is a 2 ns delay between the initial clk2 that was input into MUX 302b and the clock eventually received by the FF2 circuitry via the clock routing lines, such as line 306b. The different clock delays experienced by FF1 FF2 do not tend to be a problem during user mode because these circuits are generally designed to handle the different clocks, even during cross-domain communication (e.g., 320 of FIG. 3).

Figure 4B:
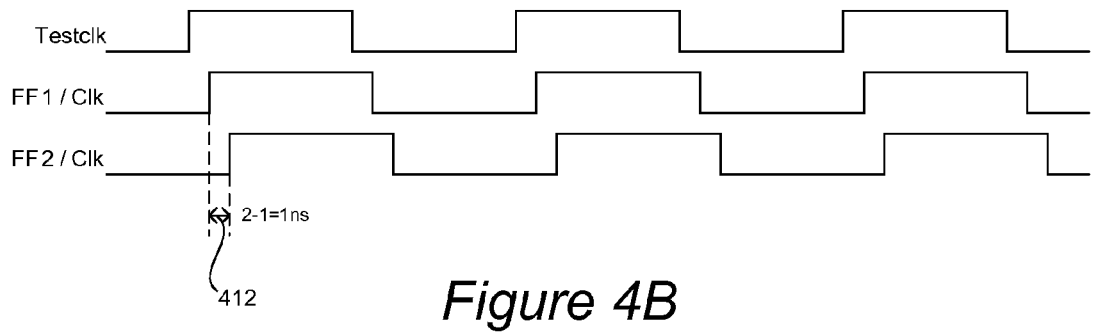
FIG. 4B is a timing diagram for automatic test pattern generation (ATPG) operation of the single clock BIST system of FIG. 3.

Different clock delays for different clock domains may have adverse effects during testing modes. For instance, the different delays may affect testing of the logic using automatic test pattern generation (ATPG). FIG. 4B is a timing diagram for automatic test pattern generation (ATPG) operation of the single clock BIST system of FIG. 3. As shown, there is a delay of 1 ns between the clocks used by FF1 vs. FF2.

The logic components FF1 and FF2 may include flip-flops that can be configured into one or more chains of flip-flops for receiving test data input during a scan phase of ATPG testing. During a capture phase of ATPG testing, these flip-flops are unchained and the output results and operation of such flip-flops can be analyzed.

During ATPG testing, the output of different FF paths is compared to output data that is known to be correct (referred to herein as "golden data"). Differences between the FF output and the golden data are defined as a FF error. Different flip-flop paths can be tested using shift and capture cycles. However, when there is a delay between the clocks received by the two FF circuit domains for particular paths, these paths need to be excluded from the ATPG test.

Figure 4C:
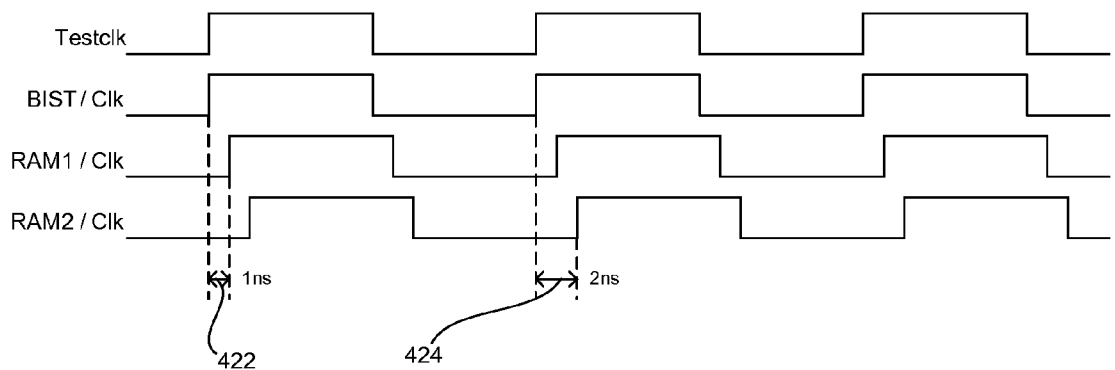
FIG. 4C is a timing diagram for BIST mode operation of the single clock BIST system of FIG. 3.

FIG. 4C is a timing diagram for BIST mode operation of the single clock BIST system of FIG. 3. As shown, the single clock Testclk is received by RAM1, RAM2, and the BIST. However, the clock Testclk is delayed differently by different clock lines before being received by RAM1 vs. RAM2. More specifically, RAM1 experiences a delay of 1 ns for Testclk via clock line 306a (see FIG. 3), while RAM2 experiences a 2 ns delay for Testclk via clock line 306b (see FIG. 3). As a result of these different clock delays, RAM1's received clock is delayed by 2 ns from BIST's received clock, and RAM2's received clock is delayed by 1 ns from BIST's received clock. These delays will cause the BIST to input test data to each RAM and receive output from each RAM at skewed times with respect to the BIST clock. The skewed timing may adversely affect the BIST (or other component's) analysis of whether each RAM is responding with the correct results at the right time.

Figure 5:
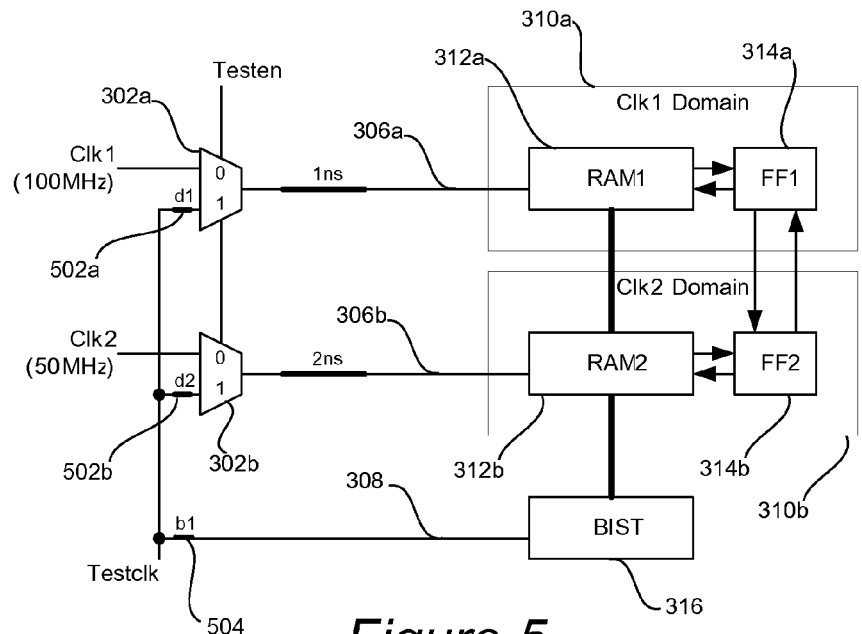
FIG. 5 is a diagrammatic representation of using a path timing constraint solution for a single clock BIST system.
Figure 6A:
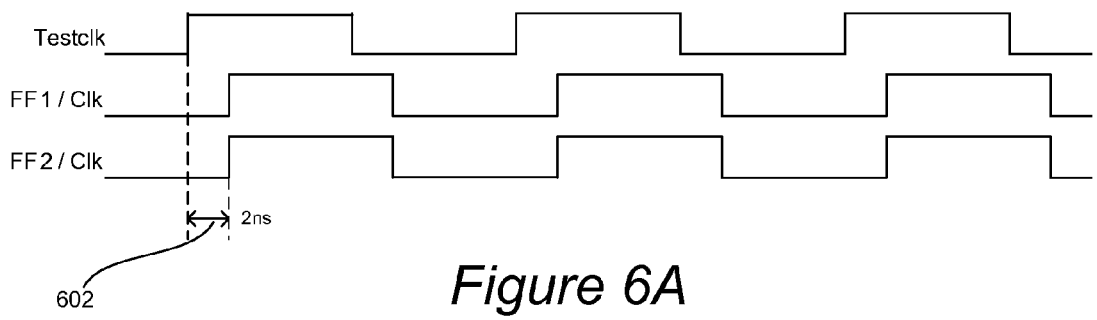
FIG. 6A is a timing diagram for implementing a path timing constraint for the ATPG operation of the single clock BIST system of FIG. 5.

Other solutions to the timing problems presented in FIGS. 3 and 4A-4C have associated issues. FIG. 5 is a diagrammatic representation of using a path timing constraint solution for a single clock BIST system. In this example, a delay may be introduced for the Testclk signal going into each RAM MUX (302a and 302b) so as to compensate for the line delay differences that would normally be present (without compensation) on the Testclk signal that is being received by FF1 314a and FF2 314b during ATPG testing. In the current example, a delay d1=1 ns (502a) is inserted for the Testclk signal going into MUX 302a, while no delay (i.e., d2=0, 502b) is inserted for the Testclk signal going into MUX 302b. As a result, the Testclk input to FF1 314a via MUX 302a is delayed by 2 ns (1 ns from d1 plus 1 ns delay on line 306a). The Testclk input to FF2 314b via MUX 302b is also delayed by 2 ns (0 for d2 plus 2 ns delay on line 306b). FIG. 6A is a timing diagram that illustrates the FF1 clock and FF2 clock as having a same 2 ns delay 602 thereby alleviating ATPG timing issues.

Figure 6B:
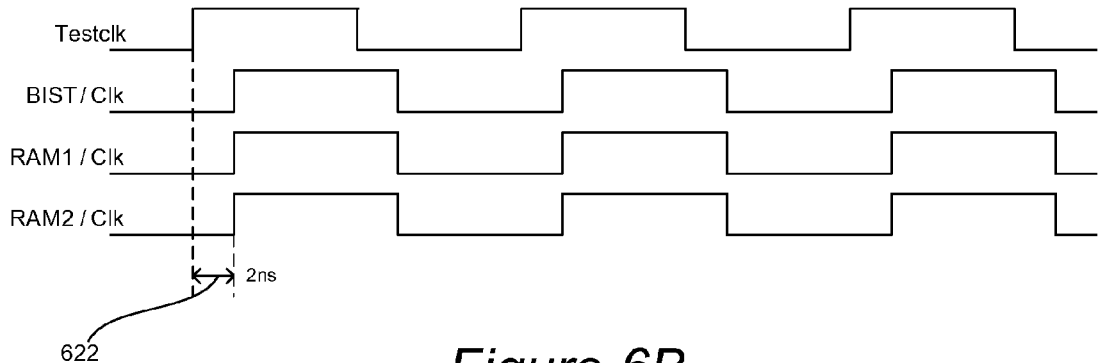
FIG. 6B is a timing diagram for implementing a path timing constraint for the BIST operation of the single clock BIST system of FIG. 5.

After compensatory delays for ATPG testing are added for the entire circuit for all clock domains, one may also add a delay for the BIST clock so that the BIST clock can align with the clocks received by the RAMs. FIG. 6B is a timing diagram for implementing a path timing constraint for the BIST operation of the single clock BIST system of FIG. 5. As shown, a delay 602 (b1 504 of FIG. 5) is introduced for the Testclk signal received into the BIST 316. If the timing delays added for the ATPG timing are correct, the clocks for all the RAMs (e.g., RAM1 312a and RAM2 312b) and the BIST 316 can be aligned if the circuit design is relatively simple. In the illustrated simple example, a delay of b1=2 ns (504) is inserted on Testclk's input line 504 to BIST 316, while d1=1 ns and d2=0 have been inserted for ATPG testing. These delay compensations result in an aligned Testclk being received by RAM1, RAM2, and BIST. In the present example of FIG. 6B, each Testclk signal received by RAM1, RAM2, and BIST has a 2 ns delay (622) with respect to the initial Testclk signal.

Although compensating for ATPG and BIST timing issues may be achieved by introduction of delays for each received FF clock (and also corresponding RAM clocks) and then introduction of a delay for the received BIST clock, this technique may not be practical for every circuit. As circuits become more complex and utilize a significant number of different clock domains, introducing delays for all of the clock domain circuits may be very time-consuming and sometimes impossible. For instance, the delay introduced for the BIST clock is based on an analysis through all clock domain frequencies using a single Testclk as a source. Accordingly, a significant number of iterations of different possible ATPG and BIST delay compensation values would need to be performed to find compensation values that result in alignment of a high number of clock signals received by the different circuitry domains and the BIST. The BIST delay may also be selected incorrectly if any of the ATPG timing delays were incorrectly set since the BIST delay depends on the delay values that are selected for resolving ATPG timing issues.

Figure 7:
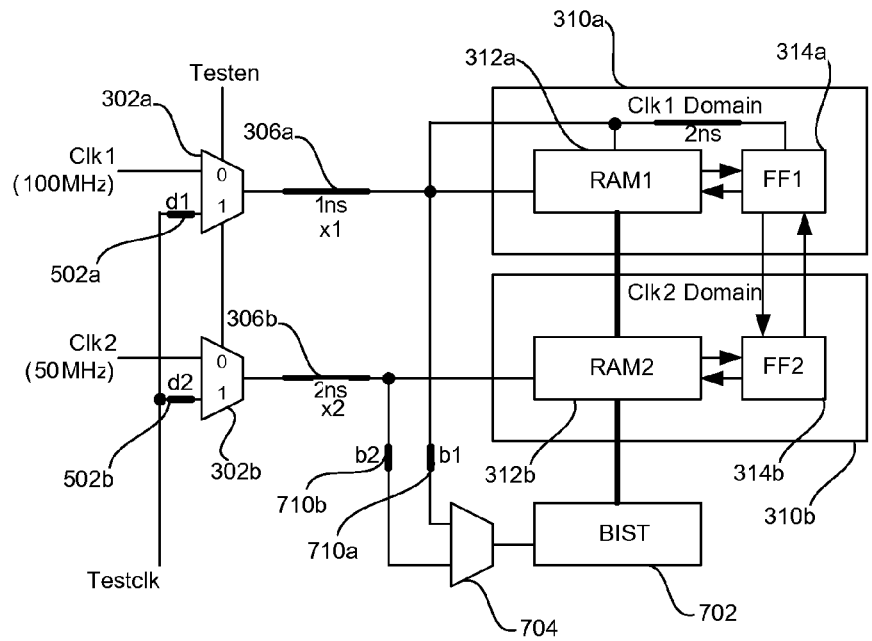
FIG. 7 is a diagrammatic representation of a BIST system implementing clock multiplexing for testing memory in multiple clock domains in accordance with one embodiment of the present invention.

FIG. 7 is a diagrammatic representation of a BIST system implementing clock multiplexing for testing memory in multiple clock domains in accordance with one embodiment of the present invention. For clarity purposes, only two domains are illustrated. However, this illustrated system may be easily scaled to include any number of clock domain circuitry. As shown, first and second inputs of MUX 302a are communicatively coupled with Clk1 and Testclk. Similarly, first and second inputs of MUX 302b are communicatively coupled with Clk2 and Testclk. The output of MUX 302a is communicatively coupled with RAM1, FF1, and a first input of BIST MUX 704, while the output of MUX 302b is communicatively coupled with RAM2, FF2, and a second input of BIST MUX 704. BIST 702 is communicatively coupled with the output of BIST MUX, as well as RAM1, RAM2, FF1, and FF2.

In operation, MUX 302a receives and passes one of two signals Clk1 or Testclk, while MUX 302b receives and passes one of two signals Clk2 or Testclk. The output of MUX 302a is transmitted on line 306a to RAM1/FF1 in domain 310a and BIST MUX 704, and the output of MUX 302b is transmitted on line 306b to RAM2/FF2 in domain 310b and BIST MUX 704. The output of BIST MUX 704 is output to BIST 702 and the BIST communicates with RAM1 and RAM2 during test enablement. Although the illustrated system uses multiplexers to switch between user mode and BIST clock output, any suitable switching mechanism may be used to accomplish this selection of clocks.

During a design for test (DFT) phase, delays may be inserted to compensate for line delays for the Testclk during ATPG testing of FF1 and FF2, by way of examples. In the illustrated implementation, a delay of 1 ns (d2) may be possibly inserted on the Testclk input to MUX 302b to compensate for the extra delay of 3 ns from MUX 302a to FF1. In embodiments of the present invention, insertion of delays that fail to compensate for timing issues during ATPG would not affect BIST timing. In illustrated example, a delay d2=1 ns is inserted on the Testclk input to MUX 302b.

During BIST test enablement, the BIST is configured to facilitate testing of RAM1 and RAM2. When the Testclk is enabled (via signal Testen=1 input to MUX 302a and 302b), the Testclk signal is delayed by d1=0 ns before being input to MUX 302a, passed by MUX 302a through line 306a having a delay 1 ns to RAM1 312a to result in a first Testclk having total delay of 1 ns. Likewise, the Testclk signal is delayed by d2=1 ns before being input to MUX 302b, passed by MUX 302b through line 306b having a delay 2 ns to RAM2 312b to result in a second Testclk having total delay of 3 ns.

In this simple two clock domain example, the first and second Testclk signals that are received into their respective RAMs are also selectively input to the BIST when testing the corresponding RAM. As shown, a MUX 704 may receive the first delayed Testclk signal that is being input to RAM1 312a and the second delayed Testclk signal that is being input to RAM2 312b. The MUX then selectively outputs one of these received clocks to BIST 702.

Figure 8:
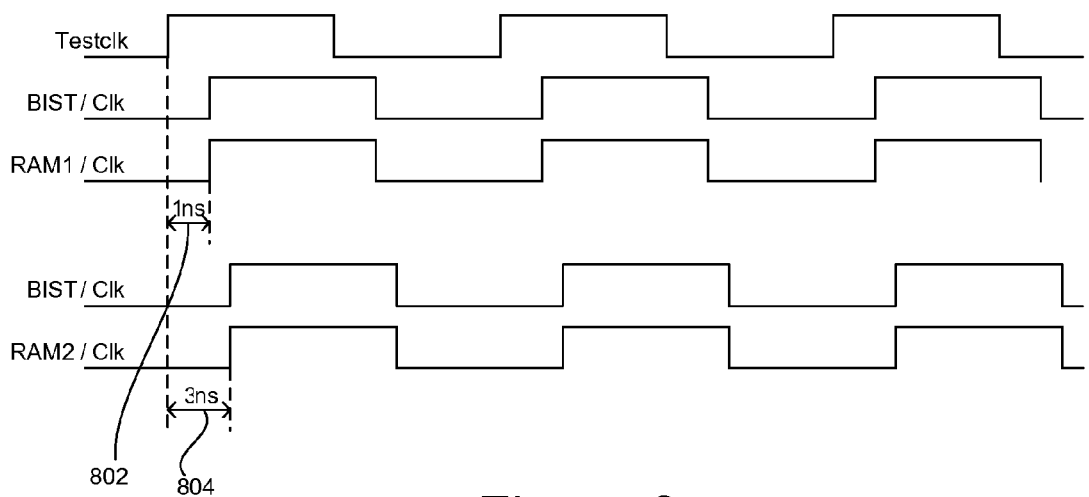
FIG. 8 is a timing diagram illustrating resolution of clock timing issues for the BIST system of FIG. 7.

As shown, these differently delayed first and second Testclk signals still result in aligned clocks during testing of each RAM. FIG. 8 includes a timing diagram illustrating resolution of clock timing issues for the BIST system of FIG. 7. When RAM1 312a is being tested, MUX 704 selectively outputs the first delayed Testclk signal, which is also received by RAM1 312a, to the BIST 702. This first delayed Testclk signal is aligned for both the RAM1 312a undergoing testing and the BIST 702. That is, the first delayed Testclk used by RAM1 312a and BIST 702 both have a total delay 802 of 1 ns (d1+line 306a=0 ns+1 ns) with respect to the initial Testclk input. When RAM2 312b is being tested, MUX 704 selectively outputs the second delayed Testclk signal, which is also received by RAM2 312b, to the BIST 702. This second delayed Testclk signal has the same alignment for both the RAM2 312b undergoing testing and BIST 702. In this example, the second delayed Testclk has a total delay 804 of 3 ns (d2+line 306b=1 ns+2 ns) with respect to the initial Testclk input.

The design for test (DFT) phase could also add delay circuits b1 (710a) and b2 (710b) if needed. For instance, b1 could compensate for more line delay being present in the path from MUX 302a to the RAM1 312a than in the path from the MUX 302a to the BIST 702. Likewise, b2 could compensate for more line delay in the path from MUX 302b to the RAM2 312b than in the path from the MUX 302b to the BIST 702. For example, if Testclk signal was routed from a point right after the MUX 302b directly to the BIST with minimum extra line delay, b2 would be set to 2 ns. In the present example, b1 and b2 equal zero since the line path delay between the MUX 302a and RAM1 is equal to the line path delay between the MUX 302a and BIST 702. Likewise, the line path delay between the MUX 302b and RAM2 is equal to the line path delay between the MUX 302b and BIST 702.

The clock used for BIST testing of each RAM meet the same timing as the clock received by such RAM such testing. Additionally, the clock used by the BIST (and the RAMs) is decoupled from the ATPG timing. That is, the values of d1 and d2 are unimportant for the BIST timing. Since BIST timing is decoupled from and does not depend on the ATPG timing, exceptions in ATPG timing can be tolerated by the BIST clock. That is, a delay (e.g., d1 or d2) does not have to be set for each clock domain circuit or memory.

Figure 9A:
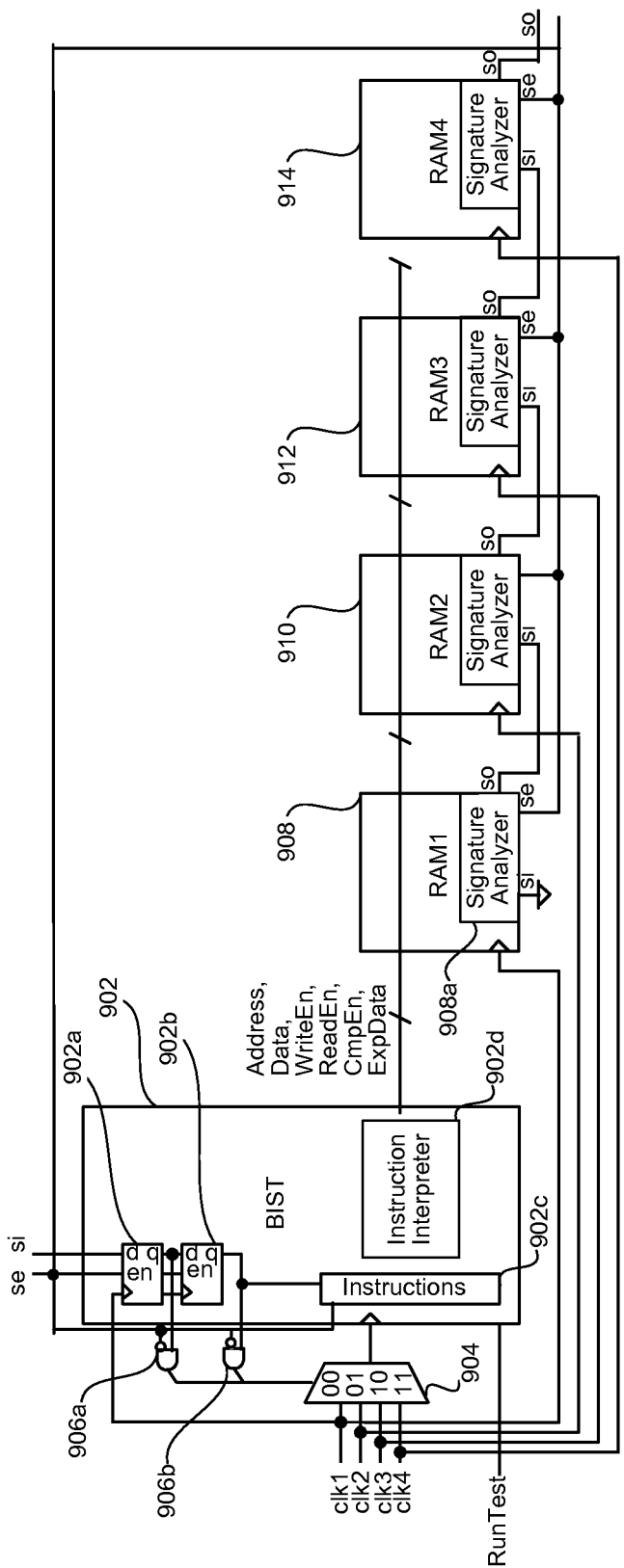
FIG. 9A includes a detailed block diagram for a BIST system in accordance with a specific implementation of the present invention.
Figure 9B:
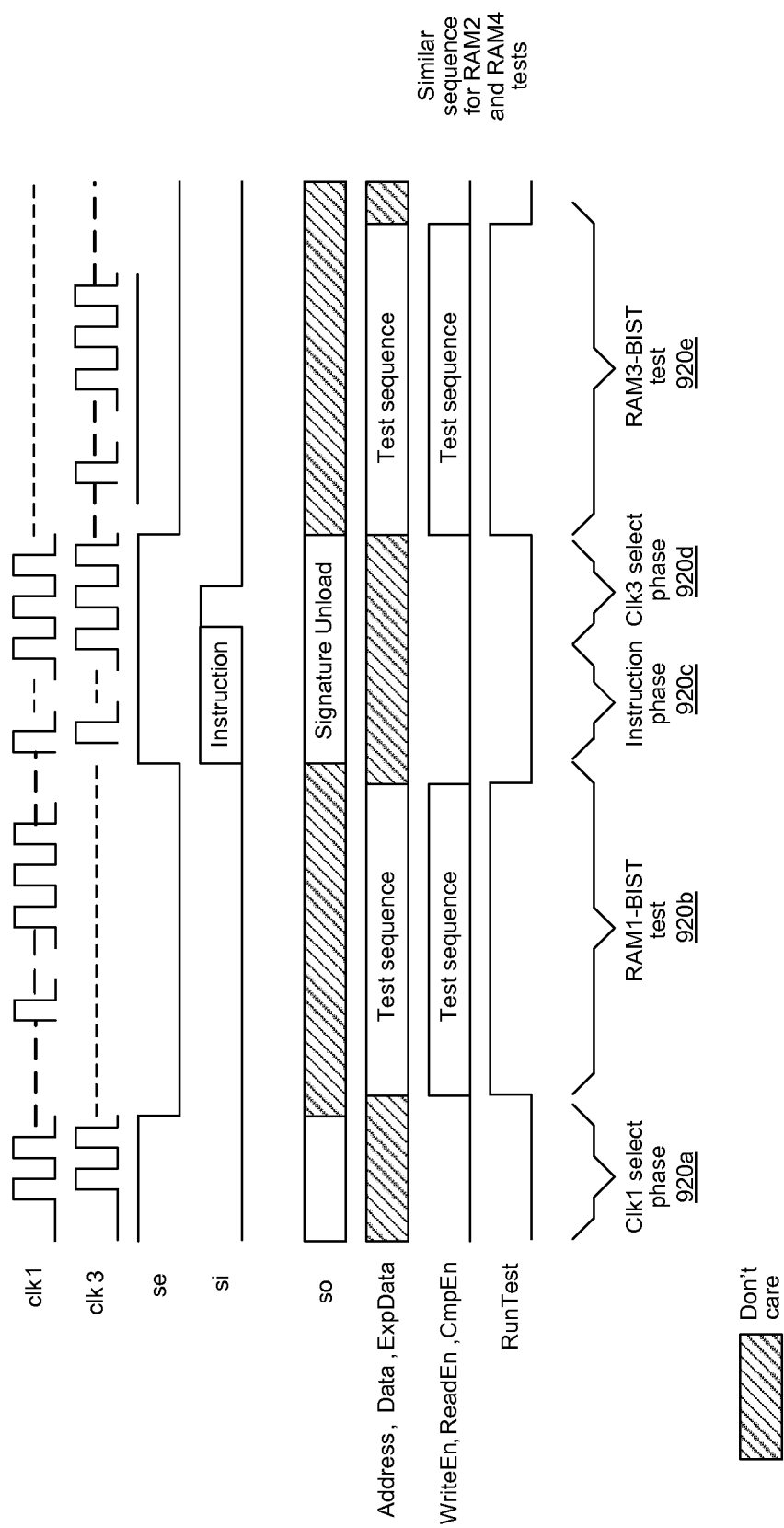
FIG. 9B includes a detailed timing diagram for a BIST system in accordance with a specific implementation of the present invention.

FIG. 9A includes a detailed block diagram and timing diagram for a BIST system in accordance with a specific implementation of the present invention. FIG. 9B includes a timing diagram for the detailed BIST system of FIG. 9A in accordance with a specific implementation of the present invention. These two drawings will be described together. In this example RAM1 908, RAM2 910, RAM3 912, and RAM4 914 are designed to operate within different clock domains in user mode. In user mode, RAM1~RAM4 will receive different user mode clocks (not shown) having different domain characteristics, such as different frequencies, different phases, etc., or any combination thereof. The different user mode clocks (not shown) as such clocks reach their respective memory device will also have different delays (line delay plus ATPG delay when inserted during DFT phase). Specifically, each path between the user mode clock input and the corresponding receiving memory device will have a particular delay.

During a test mode (e.g., BIST or ATPG), the different memory devices (e.g., RAM1~RAM4) may be arranged to receive differently delayed test clock signals that each have been delayed in a similar manner as the different user mode clocks although such delayed test clock signals will have the same domain characteristics, such as frequency and phase. For example, during a RAM1-BIST test phase 920b, Clk1 is used. Likewise during a RAM3-BIST test phase 920e, Clk3 is used. The domain characteristics of the differently delayed test clock signals can be the same as any one of the domain characteristics of the user mode clocks. Alternatively, the domain characteristics of the differently delayed clock signals can differ from all of domain characteristics the user mode clocks.

Test clocks Clk1, Clk2, Clk3, and Clk4 each originate from a single input Testclk signal that is delayed differently by the respective memory device's line delay plus any ATPG delay before being input to the respective receiving memory device RAM1, RAM2, RAM3, and RAM4, respectively. For instance, the initial input test clock is delayed by ATPG delay d1 plus a first line delay x1 before being received as delayed test clock Clk1 by RAM1, while the same initial test clock is delayed by ATPG delay d2 plus a second different line delay x2 before being received as test clock Clk2 by RAM2. Clk3 and Clk4 are similarly received by RAM3 and RAM4, respectively, and may have different associated ATPG delays (if any) and/or different line delays.

Any suitable mechanism may be utilized to select one of these differently delayed test clocks, which are also being input to a corresponding memory device. In a specific implementation, one or more registers are used for storing clock selection data. Any number of clock selection registers for selecting Clk1, Clk2, Clk3, or Clk4 may be associated with BIST 902. In the illustrated example, only two registers 902a and 902b are used to provide two bits that are output to MUX 904 for selecting between four different test clocks Clk1~Clk4. Of course, more registers and bits can be used to select from a higher number of test clocks. In the illustrated example, these clock selection registers 902a and 902b receive two bits of clock selection data on a scan input (SI) signal. In one embodiment, two cycles of one of the clocks (e.g., Clk1) are used to define the two bits of clock selection data received on the SI signal when a clock selection phase (e.g., 920a or 920d) is enabled as shown in FIG. 9B.

A clock selection phase may commence based on any suitable signals. As shown, a clk1 select phase 920a precedes a RAM1-BIST test phase 920b. The timing diagram of FIG. 9A also illustrates a clk3 select phase 920d that precedes a RAM3-BIST test phase 920e. In the illustrated example, a scan enable (SE) signal may be set high and a RunTest signal may be set low for each clock selection phase. The value of SI for two clock cycles of Clk1 selects a particular clock when SE is set high. Any of the test clocks may be used for the clock selection phase. Table 1 illustrates the settings for SI and corresponding clock selections.

TABLE 1

| Clock Selection | | |
|---|---|---|
| Clock Selection | S1 value for 1$^{st}$ Clk1 period | S1 value for 2nd Clk1 period |
| Clk1 | 0 | 0 |
| Clk2 | 0 | 1 |
| Clk3 | 1 | 0 |
| Clk4 | 1 | 1 |

When SE is set high to load into clock select register, MUX 904 defaults to Clk1 because AND gates 906a and 906b output low. This ensures glitch-free clock output from MUX 904. Note that the SE is inverted when feeding into AND gate. If "00" is loaded through SI for selecting Clk1, clock selection registers 902a and 902b output two bits 0 and 0 to respective 2-input AND gates 906a and 906b. Each 2-input AND gate also receives the SE signal, which is set low after clock select phase. Thus, the two AND gates 906a and 906b would output two bits having values 00 to MUX 904, which then outputs Clk1. When SI has values "10" for selecting Clk3 and SE is set low, AND gate 906a outputs "1" and AND gate 906b outputs "0" to MUX 904, which then outputs Clk3. Clocks Clk2 and Clk4 can be similarly selected.

After a BIST clock is selected, a memory BIST test phase may then commence by setting SE low and RunTest high. As shown, after clock Clk1 is selected during clock selection phase 920a, RAM1-BIST test phase 920b commences. Likewise, after clock Clk3 is selected during clock selection phase 920d, RAM3-BIST test phase 920e commences. Tests for RAM2-BIST and RAM4-BIST may likewise be started.

In general, data may be input to test each memory device through any suitable mechanism. In the present example, the BIST includes an instructions module 902c that is configured to specify how test data is to be generated by the BIST 902. The BIST may also include an instructions interpreter 902d that interprets the instructions to generate test data for the memory under test. For example, an instruction may specify to write 0's into memory addresses 0 to 99, read 1's from address 99 to 0, or other combinations of reads and write instructions. Alternatively, data for testing RAM1~RAM4 may be loaded into the BIST from an external device.

The instructions may be loaded once into the instructions module 902c from an external source (e.g., outside test equipment), and these loaded instruction are then used to generate multiple steps that include addresses, data, read, write, and comparison sequences. In this embodiment, instructions module 902c may form part of a BIST scan register chain, while a portion of such BIST scan register chain corresponds to the clock selection registers for selecting the BIST test clock.

When RunTest is set high, the BIST can be enabled to perform a memory test. In a specific example, instructions module 902c generates address, test data, write enable, read enable, compare enable, and golden data, which can be sent in parallel via a parallel bus to RAM1, RAM2, RAM3, or RAM4. During BIST mode, the BIST writes test data to the addresses of the memory device that are being tested using the same clock as the clock that is used by each memory device. The BIST for testing each memory device can be performed in any desired format. For example, BIST 902 can cycle through all of the memory addresses in different orders and create different combinations of memory test patterns. Test bits can be stored at the randomly generated memory addresses in the memory blocks. The BIST write data is altered by the memory cells if the memory cells contain any defects.

Any suitable mechanism may be utilized to check the memory. For example, each memory may include a signature analyzer module (e.g., 908a, 908b, 908c, and 908d) for receiving the golden data (e.g., ExpData) and comparing data read from each memory device to such golden data. The golden data may be written to a different address of the memory (e.g., within the signature analyzer) than the corresponding test data that is written by the BIST to the particular memory. Alternatively, the test data that is written into a memory device may be written to both the signature analyzer and the particular memory device address under test.

Each signature analyzer module may output a result scan output (SO) signal the next RAM or to the BIST for analysis. For example, each SO signal may carry the corresponding signature analyzer's results at the end of every RAM-BIST test phase to the SI signal input to the next RAM's signature analyzer. For instance, SO results are output during a signature unload phase. In FIG. 9B, the signature unload phase for the RAM1-BIST test is shown as occurring at the same time as the instruction phase 920c and clk3 select phase 920d. In a specific example, the signature unload of the current memory under test is only analyzed by the BIST, while signature unload data from the other memory, which is not under test, are ignored.

Signature analyzer accumulates test results from comparing each of the memory reads against the golden data. The result is serially shifted out via SO. The output specifies whether the RAM has failed the test. In one example, the SO signal is a 1 value when the RAM has failed the test. The SO signal can be output from the memory device and analyzed externally or analyzed internally by the BIST, after which the BIST would output another signal externally from the device that indicates pass or fail results for each memory device. Each signature analyzer can be clocked by the domain clock where it resides in. Cascading SO to the next signature analyzer in a different clock domain makes SO a domain crossing signal. A negative edge lock-up latch can be inserted at the end of each signature analyzer to facilitate SI-SO carry connection across clock domains without hold time violations. Setup time is usually not a concern because signature unload is performed at low frequency.

In other embodiments, the BIST reads data from the corresponding memory under test into output scan register chains in the BIST, and the BIST then checks whether the output matches the expected data for the respective memory input.

Regardless of the specific BIST mechanism implemented to test each memory device, embodiments of the present invention allow the particular test clock that is received by the BIST to be aligned with the same delayed test clock that is also being input to the particular memory under test. For instance, the delay for the path between the initial test clock and the particular memory being tested is substantially equal to the delay for the path between the initial test clock and the BIST that is testing such particular memory.

Figure 10:
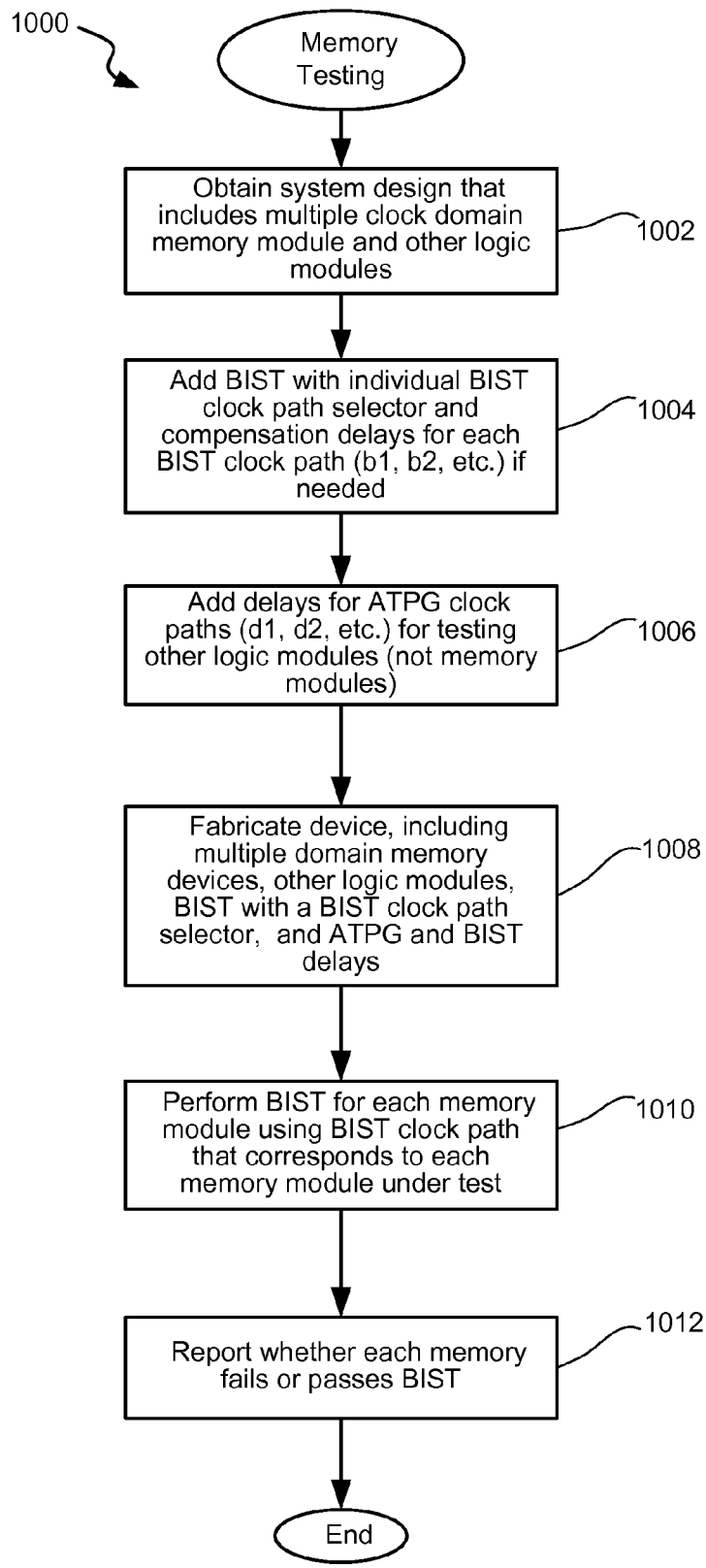
FIG. 10 is a flow chart illustrating a procedure for performing BIST testing on multiple memory clock domains in accordance with a specific implementation of the present invention.

FIG. 10 is a flow chart illustrating a procedure 1000 for testing memory that operates in different clock domains in accordance with a specific implementation of the present invention. Initially, a system design that includes multiple clock domain memory modules and other logic modules is obtained in operation 1002. For the example in FIG. 7, the logic design for RAM1 and FF1 that utilize clock domain Clk1 and the design for RAM2 and FF2 that utilize Clk2 are provided. Mechanisms for implementing a device based on logic design information are further described herein.

A BIST module with an individual clock path selector may be added in operation 1004. For instance, MUX 302a and 302b are added to select between clk1 and Testclk and between clk2 and Testclk, respectively. Clock selection MUX 704 and BIST module 702 are also added. Compensation delays for each BIST clock path may also be added if needed in operation 1004. BIST clock path delay components may need to be added if a delay on the path between the test clock input and a memory device differs from the delay on the path between the test clock input and the BIST. For instance, b1 and b2 delay circuits or components may also be added to the design in operation 1004. By way of example, a delay component can take the form of delay chain constructor from buffers. A buffer can be formed from logic gates, such as back-to-back connection of two inverters. The input takes a finite time to pass through the buffer. Depending of delay resolution required, buffers can be sized accordingly. For instance, a buffer may contribute 0.1 ns delay from input to output. A chain of 5 buffers would then provide 0.5 ns delay.

Any delays for ATPG clocks paths for testing other logic (e.g., not memory) may also be added in operation 1006. With respect to FIG. 7, delays d1 and d2 may be added to compensate for line delays on lines 306a and 306b. All or some of the operations for adding ATPG clock path delays may be performed to all or some of the operations for adding BIST clock path delays. The order does not matter since the BIST clock timing is not impacted by any delays added for ATPG testing.

A device having multiple clock domain memory devices, other logic modules, a BIST with a BIST clock path selector, and ATPG and BIST delays may then be fabricated in operation 1008. A BIST may then be performed for each memory module using the BIST clock path that corresponds to each memory module under test in operation 1010. For instance, individual BIST clock paths corresponding to Clk1~Clk4 of FIG. 7 are selected for a BIST mode test of individual RAM1~RAM4, respectively.

Whether each memory module has passed or failed BIST may also be reported in operation 1012. For example, the report may be in the form of one or more signals output from the device. Such output signals can specify a memory module, one or more memory cells of the specified memory module, and whether such specified one or more memory cells have failed or passed. Alternatively, a signal can be output for a specific memory module that has passed BIST, or a signal can be output for a specific memory module that has failed BIST. The memory testing procedure 1000 for the particular system device may then end.

Figure 11:
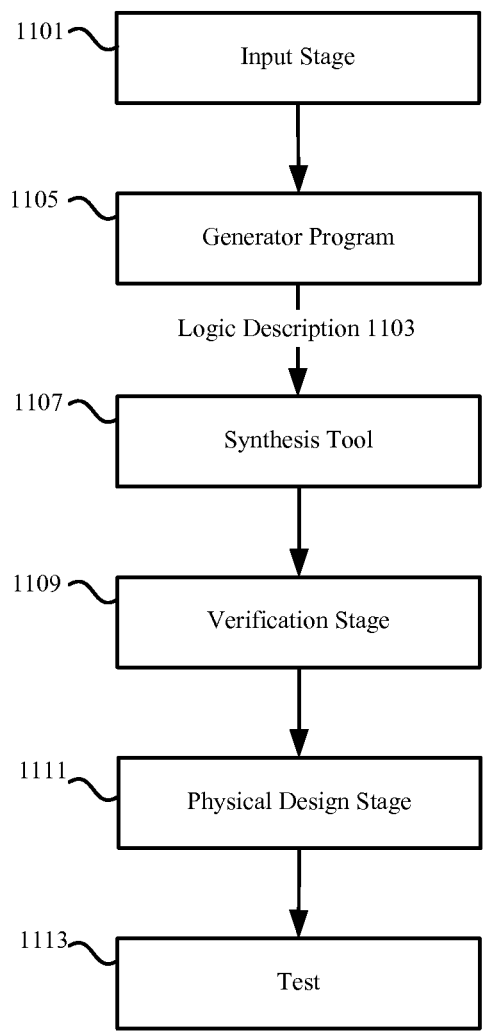
FIG. 11 illustrates an exemplary technique for implementing a programmable chip in accordance to one embodiment of the present invention.

Although the techniques and mechanisms of the present invention can be used on a variety of devices such as ASICs, ASSPs, controllers, processors, etc., one particular example of a device that can implement a BIST for testing different clock domain memory devices is a programmable chip. Programmable chips have a number of memory devices that operate in different clock domains, which memory devices can be tested using a BIST. FIG. 11 is a diagrammatic representation showing implementation of a programmable chip. An input stage 1101 receives selection information typically from a user for logic to be implemented on an electronic device. In one example, the input received is in the form of a high-level language program. A generator program 1105 creates a logic description and provides the logic description 1103 along with other customized logic to any of a variety of synthesis tools, place and route programs, and logic configuration tools to allow a logic description to be implemented on an electronic device.

In one example, an input stage 1101 often allows selection and parameterization of components to be used on an electronic device. The input stage 1101 also allows configuration of hard coded logic. In some examples, components provided to an input stage include prepackaged logic such as intellectual property functions, mega-functions, and intellectual property cores. The input stage 1101 may be a graphical user interface using wizards for allowing efficient or convenient entry of information. The input stage may also be a text interface or a program reading a data file such as a spreadsheet, database table, or schematic to acquire selection information. The input stage 1101 produces an output containing information about the various modules selected. At this stage, the user may also add DFT components to the design. For instance, delay components for ATPG and BIST timing can be added as described herein.

In typical implementations, the generator program 1105 can identify the selections and generate a logic description 1103 with information for implementing the various modules. The generator program 1105 can be a Perl script creating HDL files such as Verilog, Abel, VHDL, and AHDL files from the module information entered by a user. In one example, the generator program identifies a portion of a high-level language program to accelerate. The other code is left for execution on a processor core. According to various embodiments, the generator program 1105 identifies pointers and provides ports for each pointer. One tool with generator program capabilities is System on a Programmable Chip (SOPC) Builder available from Altera Corporation of San Jose, Calif. The generator program 1105 also provides information to a synthesis tool 1107 to allow HDL files to be automatically synthesized. In some examples, a logic description is provided directly by a designer. Hookups between various components selected by a user are also interconnected by a generator program. Some of the available synthesis tools are Leonardo Spectrum, available from Mentor Graphics Corporation of Wilsonville, Oreg. and Synplify available from Synplicity Corporation of Sunnyvale, Calif. The HDL files may contain technology specific code readable only by a synthesis tool. The HDL files at this point may also be passed to a simulation tool at a verification stage 1109.

As will be appreciated by one of skill in the art, the input stage 1101, generator program 1105, and synthesis tool 1107 can be separate programs. The interface between the separate programs can be a database file, a log, or simply messages transmitted between the programs. For example, instead of writing a file to storage, the input stage 1101 can send messages directly to the generator program 1105 to allow the generator program to create a logic description. Similarly, the generator program can provide information directly to the synthesis tool instead of writing HDL files. Similarly, input stage 1101, generator program 1105, and synthesis tool 1107 can be integrated into a single program.

A user may select various modules and an integrated program can then take the user selections and output a logic description in the form of a synthesized netlist without intermediate files. Any mechanism for depicting the logic to be implemented on an electronic device is referred to herein as a logic description. According to various embodiments, a logic description is an HDL file such as a VHDL, Abel, AHDL, or Verilog file. A logic description may be in various stages of processing between the user selection of components and parameters to the final configuration of the device. According to other embodiments, a logic description is a synthesized netlist such as an Electronic Design Interchange Format Input File (EDF file). An EDF file is one example of a synthesized netlist file that can be output by the synthesis tool 1107.

A synthesis tool 1107 can take HDL files and output EDF files. Tools for synthesis allow the implementation of the logic design on an electronic device. Some of the available synthesis tools are Leonardo Spectrum, available from Mentor Graphics Corporation of Wilsonville, Oreg. and Synplify available from Synplicity Corporation of Sunnyvale, Calif. Various synthesized netlist formats will be appreciated by one of skill in the art.

A verification stage 1109 typically follows the synthesis stage 1107. The verification stage checks the accuracy of the design to ensure that an intermediate or final design realizes the expected requirements. A verification stage typically includes simulation tools and timing analysis tools. At this stage, the user may also add or modify DFT components to the design. For instance, delay components for ATPG and BIST timing can be added or modified as described herein. Tools for simulation allow the application of inputs and the observation of outputs without having to implement a physical device. Simulation tools provide designers with cost effective and efficient mechanisms for both functional and timing verification of a design. Functional verification involves the circuit's logical operation independent of timing considerations. Parameters such as gate delays are disregarded.

Timing verification involves the analysis of the design's operation with timing delays. Setup, hold, and other timing requirements for sequential devices such as flip-flops are confirmed. Some available simulation tools include Synopsys VCS, VSS, and Scirocco, available from Synopsys Corporation of Sunnyvale, Calif. and Cadence NC-Verilog and NC-VHDL available from Cadence Design Systems of San Jose, Calif. After the verification stage 1109, the synthesized netlist file can be provided to physical design tools 1111 including place and route and configuration tools. A place and route tool locates logic cells on specific logic elements of a target hardware device and connects wires between the inputs and outputs of the various logic elements in accordance with logic and security provided to implement an electronic design. According to various embodiments of the present invention, the place and route tool may perform the techniques of the present invention to implement the various delay path requirements as defined by the user. The iterative technique may be transparent to the user, but the resulting device can be physically tested (e.g., BIST) at 1113.

For programmable logic devices, a programmable logic configuration stage can take the output of the place and route tool to program the logic device with the user selected and parameterized modules. According to various embodiments, the place and route tool and the logic configuration stage are provided in the Quartus Development Tool, available from Altera Corporation of San Jose, Calif. As will be appreciated by one of skill in the art, a variety of synthesis, place and route, and programmable logic configuration tools can be used using various techniques of the present invention.

As noted above, different stages and programs can be integrated in a variety of manners. According to one embodiment, the input stage 1101, the generator program 1105, the synthesis tool 1107, the verification tools 1109, and physical design tools 1111 are integrated into a single program. The various stages are automatically run and transparent to a user. The program can receive the user-selected modules, generate a logic description depicting logic for implementing the various selected modules, and implement the electronic device. As will be appreciated by one of skill in the art, HDL files and EDF files are mere examples of a logic description. Other file formats as well as internal program representations are other examples of a logic description.

All or some portions of the disclosed techniques of the present invention (e.g., such as the DFT phase) may be implemented in any suitable combination of software and/or hardware, such as a web-based server or desktop computer system. Moreover, a system implementing various embodiments of the invention may be a portable device, such as a laptop or cell phone. The apparatus and/or web browser of this invention may be specially constructed for the required purposes, or it may be a general-purpose computer selectively activated or reconfigured by a computer program and/or data structure stored in the computer. The processes presented herein are not inherently related to any particular computer or other apparatus. In particular, various general-purpose machines may be used with programs written in accordance with the teachings herein, or it may be more convenient to construct a more specialized apparatus to perform the disclosed method steps.

Figure 12:
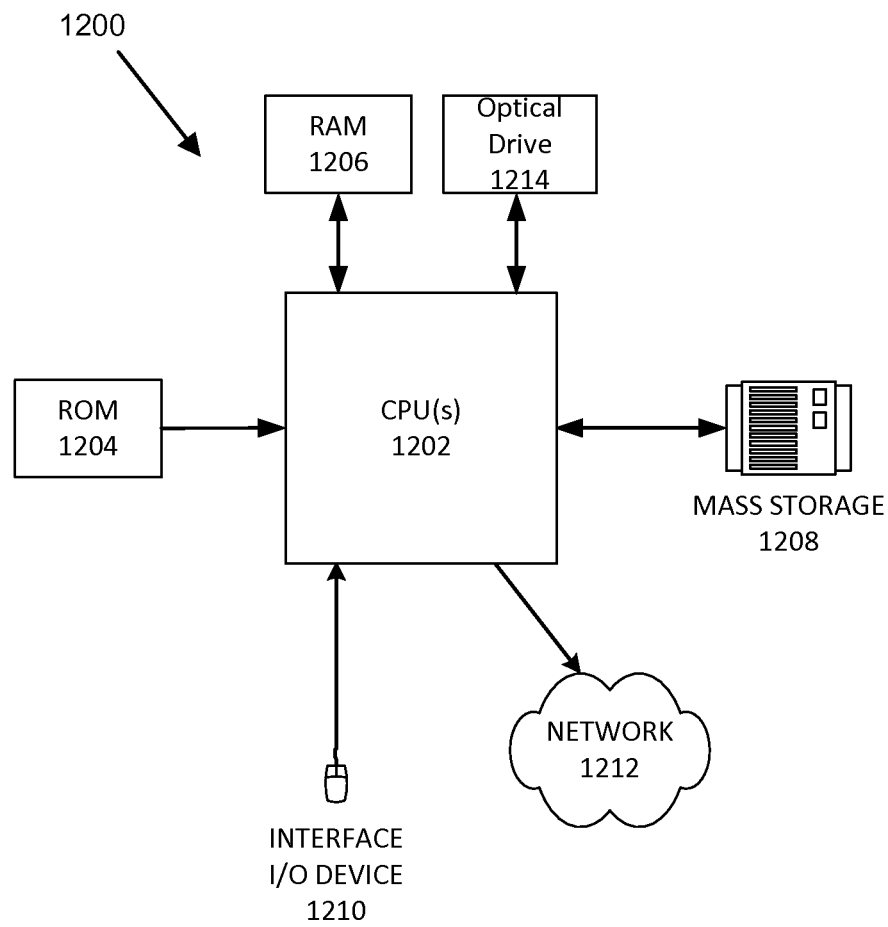
FIG. 12 is a block diagram of a typical computer system suitable for implementing an embodiment of the present invention.

FIG. 12 is a diagrammatic representation showing a typical computer system that can be used to implement a device. The computer system includes any number of processors 1202 (also referred to as central processing units, or CPUs) that are coupled to devices including memory 1206 (typically a random access memory, or "RAM"), memory 1204 (typically a read only memory, or "ROM"). The processors 1202 can be configured to generate an electronic design. As is well known in the art, memory 1204 acts to transfer data and instructions uni-directionally to the CPU and memory 1206 are used typically to transfer data and instructions in a bi-directional manner.

Both of these memory devices may include any suitable type of the computer-readable media described herein. A mass storage device 1208 is also coupled bi-directionally to CPU 1202 and provides additional data storage capacity and may include any of the computer-readable media described herein. The mass storage device 1208 may be used to store programs, data and the like and is typically a secondary storage medium such as a hard disk that is slower than memory. The mass storage device 1208 can be used to hold a library or database of prepackaged logic or intellectual property functions, as well as information on generating particular configurations. It will be appreciated that the information retained within the mass storage device 1208, may, in appropriate cases, be incorporated in standard fashion as part of memory 1206 as virtual memory. A specific mass storage device such as an optical drive 1214 may also pass data uni-directionally to the CPU.

CPU 1202 is also coupled to an interface 1210 that includes one or more input/output devices such as video monitors, track balls, mice, keyboards, microphones, touch-sensitive displays, transducer card readers, magnetic or paper tape readers, tablets, styluses, voice or handwriting recognizers, or other well-known input devices such as, of course, other computers. The CPU 1202 may be a design tool processor. Finally, CPU 1202 optionally may be coupled to a computer or telecommunications network using a network interface as shown generally at 1212. With such a network connection, it is contemplated that the CPU might receive information from the network, or might output information to the network in the course of performing the above-described process steps. It should be noted that the system 1200 might also be associated with devices for transferring completed designs onto a programmable chip. The above-described devices and materials will be familiar to those of skill in the computer hardware and software arts.

Because such information and program instructions may be employed to implement the systems/methods described herein, the present invention relates to machine readable storage media that include program instructions, state information, etc. for performing various operations described herein. Examples of machine-readable storage media include, but are not limited to, magnetic media such as hard disks, floppy disks, and magnetic tape; optical media such as CD-ROM disks; magneto-optical media such as floptical disks; and hardware devices that are specially configured to store and perform program instructions, such as ROM and RAM. Examples of program instructions include both machine code, such as produced by a compiler, and files containing higher level code that may be executed by the computer using an interpreter.

According to various embodiments, input may be obtained using a wide variety of techniques. For example, input for downloading or launching an application may be obtained via a graphical user interface from a user's interaction with a local application such as a mobile application on a mobile device, web site or web-based application or service and may be accomplished using any of a variety of well-known mechanisms for obtaining information from a user. However, it should be understood that such methods of obtaining input from a user are merely examples and that input may be obtained in many other ways.

Figure 13:
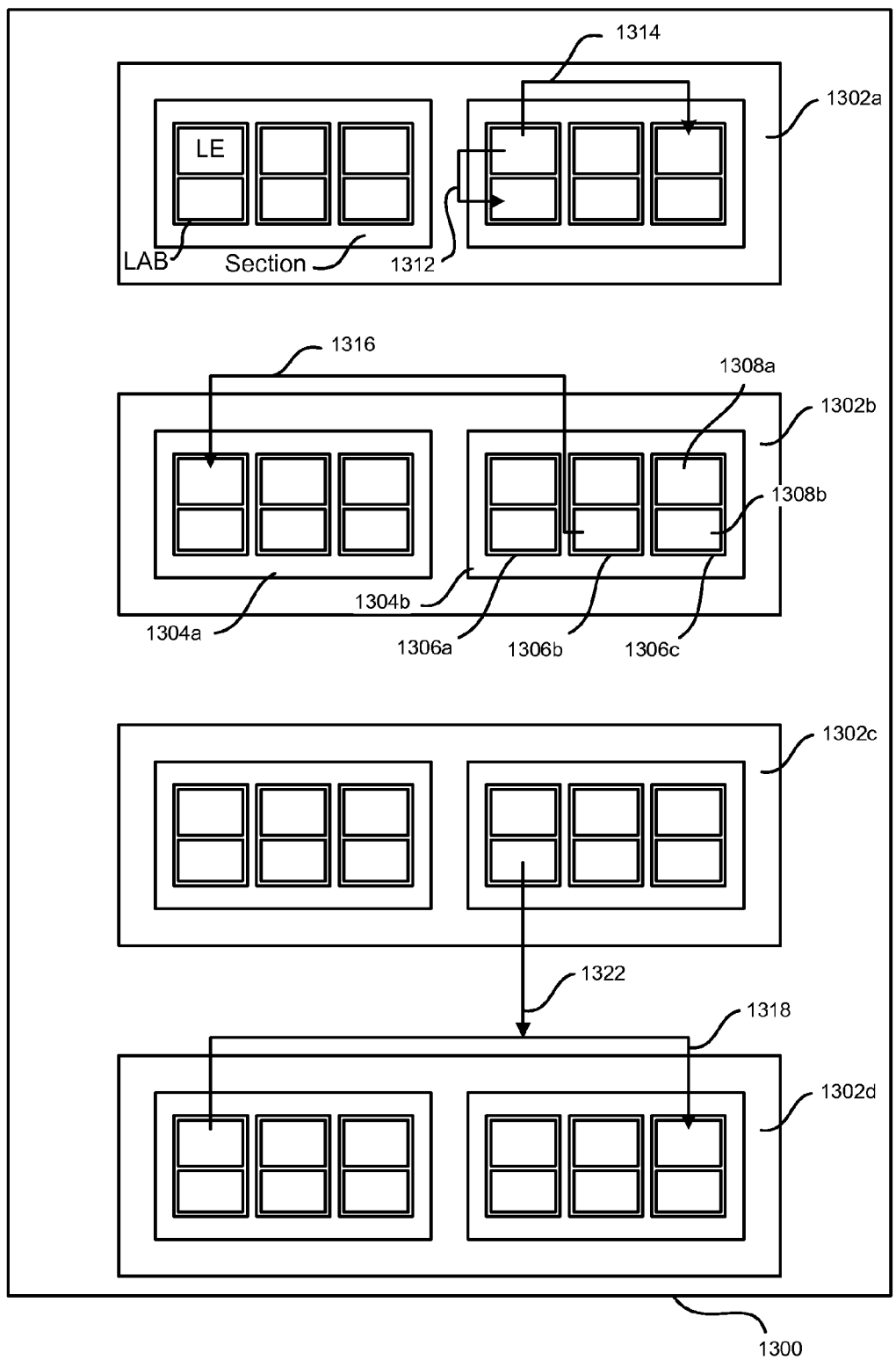
FIG. 13 is a block representation of the architecture of an arbitrary hardware device, including interconnects, which may be employed in accordance with this invention.

The form of a compiled design according to one or more embodiments of the present invention may be further understood with reference to a hypothetical target hardware device having multiple hierarchical levels. Such a hardware device is represented in FIG. 13. This representation roughly conforms to the layout of a FLEX 10K programmable logic device available from Altera Corporation of San Jose, Calif. In FIG. 13, a programmable logic device 1300 is segmented into a plurality of "rows" to facilitate interconnection between logic elements on a given row. In the hypothetical example shown, there are four rows: 1302*a*, 1302*b*, 1302*c*, and 1302*d*.

Each row of programmable logic device 1300 is further subdivided into two "half-rows." For example, row 1302*b* is shown to contain a half-row 1304*a* and a half-row 1304*b*. The next lower level of the hierarchy is the "logic array block" (LAB). Half-row 1304*b*, for example, contains three LABs: an LAB 1306*a*, an LAB 1306*b*, and an LAB 1306*c*. Finally, at the base of the hierarchy are several logic elements. Each such logic element may exist within a single logic array block. For example, LAB 1306*c* includes two logic elements: a logic element 1308*a* and a logic element 1308*b*.

In short, PLD 1300 includes four hierarchical levels: (1) rows, (2) half-rows, (3) LABs, and (4) logic elements (LEs). Any logic element within PLD 1300 can be uniquely specified (and located) by specifying a value for each of these four levels of the containment hierarchy. For example, logic element 1308*b* can be specified as follows: row (2), half-row (2), LAB (3), LE (2). To fit a logic design onto a target hardware device such as that shown in FIG. 13, a synthesized netlist may be divided into logic cells (typically containing one or more gates) which are placed in the various logic elements as uniquely defined above. Thus, each logic cell from the synthesized netlist resides in a unique single logic element.

Often, a multi-level hardware hierarchy such as that shown in PLD 1300 includes multiple levels of routing lines (interconnects). These connect the uniquely placed logic cells to complete circuits. In PLD 1300, for example, four levels of interconnect are provided, one for each of the four hierarchy levels. First a local interconnect such as interconnect 1312 is employed to connect two logic elements within the same LAB. At the next level, a LAB-to-LAB interconnect such as interconnect 1314 is employed to connect two LABs within the same half-row. At the next higher level, a "global horizontal" interconnect is employed to connect logic elements lying in the same row but in different half-rows. An example of a global horizontal interconnect is interconnect 1316 shown in row 1302*b*. Another global horizontal interconnect is shown as interconnect 1318, linking logic elements within row 1302*d*. Finally, a "global vertical" interconnect is employed to link a logic element in one row with a logic element in a different row. For example, a global vertical interconnect 1322 connects a logic element in the first LAB of the second half-row of row 1302*c* to two separate logic elements in row 1302*d*. In the embodiment shown, this is accomplished by providing global vertical interconnect 1322 between the above-described logic element in row 1302*c* to global horizontal interconnect 1318 in row 1302*d*. Consistent with the architecture of Altera Corporation's FLEX 10K CPLD, global vertical interconnects are directly coupled to the logic element transmitting a signal and indirectly coupled (through a global horizontal interconnect) to the logic elements receiving the transmitted signal.

In a target hardware device, there will be many paths available for routing a given signal line. During the routing stage, these various possible routing paths are evaluated to determine which is best for the design being fit. Briefly, in one FLEX 10K architecture, there are at least three rows, with two half-rows per row, and twelve LABs per half-row. Each LAB includes eight logic elements each of which, in turn, includes a 4-input look-up table, a programmable flip-flop, and dedicated signal paths for carry and cascade functions. The eight logic elements in an LAB can be used to create medium-sized blocks of logic—such as 9-bit counters, address decoders, or state machines—or combined across LABs to create larger logic blocks.

It should be understood that the present invention is not limited to the Altera FLEX 10K architecture or any other hardware architecture for that matter. In fact, it is not even limited to programmable logic devices. It may be employed generically in target hardware devices as broadly defined above and preferably in application specific integrated circuit designs. PLDs are just one example of ICs that can benefit from application of the present invention.

Figure 14:
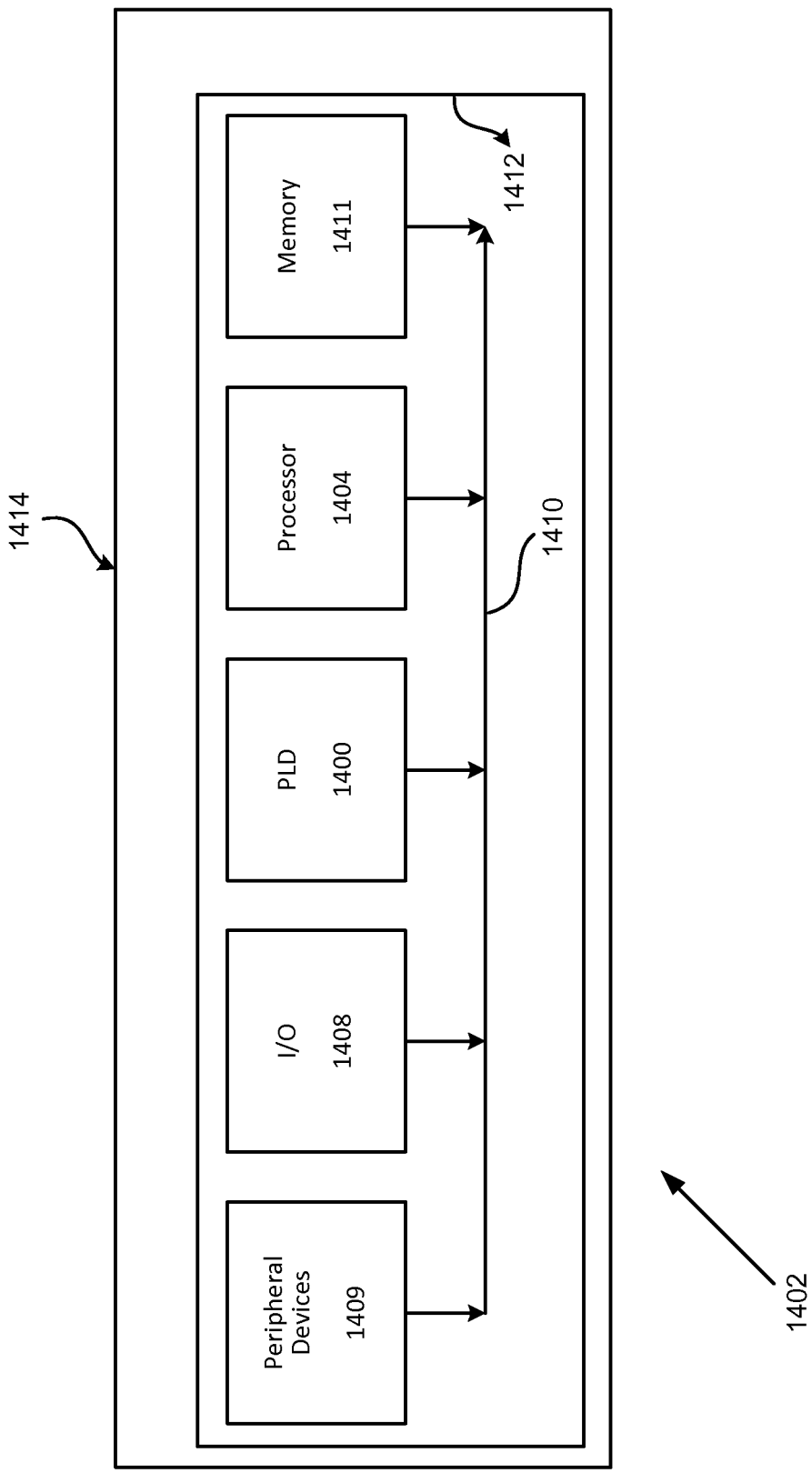
FIG. 14 is a block diagram depicting a system containing a PLD that is implemented in accordance with an example embodiment of the present invention.

Embodiments of this invention can also relate to programmable logic and other devices programmed with a design prepared in accordance with the above described methods and/or using a computer program product according to one or more embodiments of the present invention. Certain embodiments may further relate to systems employing such programmable logic devices. FIG. 14 illustrates a PLD 1400 of the present invention in a data processing system 1402. The data processing system 1402 may include one or more of the following components: a processor 1404; memory 1411; I/O circuitry 1408; and peripheral devices 1409. These components are coupled together by a system bus 1410 and are populated on a circuit board 1412 which is contained in an end-user system 1414.

The system 1402 can be used in a wide variety of applications, such as computer networking, data networking, instrumentation, video processing, digital signal processing, or any other application where the advantage of using reprogrammable logic is desirable. The PLD 1400 can be used to perform a variety of different logic functions.

Although the foregoing invention has been described in some detail for purposes of clarity of understanding, it will be apparent that certain changes and modifications may be practiced within the scope of the appended claims. Therefore, the present embodiments are to be considered as illustrative and not restrictive and the invention is not to be limited to the details given herein, but may be modified within the scope and equivalents of the appended claims.

What is claimed is:

1. An integrated circuit device comprising:
   a first memory that is operable to use a first normal mode clock having a first clock domain characteristic for a normal mode;
   a second memory that is operable to use a second normal mode clock having a second clock domain characteristic for the normal mode, wherein the first clock domain characteristic differs from the second clock domain characteristic;
   a first switching circuit that is arranged to receive the first normal mode clock and an initial test clock and to selectively output to the first memory either the first normal mode clock when the normal mode is selected or the initial test clock as a first test clock when a testing mode is selected;
   a second switching circuit that is arranged to receive the second normal mode clock and the initial test clock and to selectively output to the second memory either the second normal mode clock when the normal mode is selected or the initial test clock as a second test clock when the testing mode is selected;
   a built-in-self-test (BIST) switching circuit that is arranged to receive and output the first test clock when the first memory is being tested and to receive and output the second test clock when the second memory is being tested; and
   a built-in-self-test (BIST) circuit that is arranged to receive and use the first test clock for testing the first memory and to receive and use the second test clock for testing the second memory.

2. The device of claim 1, wherein the BIST switching circuit is arranged so that:
   a first delay associated with a first path between an output of the first switch circuit and the BIST circuit equals a delay associated with a second path between the output of the first switch circuit and the first memory so as to cause the first test clock to be aligned when received into the BIST circuit and the first memory, and
   a second delay associated with a first path between the output of the second switch circuit and the BIST circuit equals a delay associated with a second path between the output of the second switch circuit and the second memory so as to cause the second test clock to be aligned when received into the BIST circuit and the second memory.

3. The device of claim 1, further comprising:
   a first delay circuit arranged to compensate for more delay being present in a first routing path between the output of the first switch circuit and the BIST circuit than in a second routing path between the output of the first switch circuit and the first memory; and
   a second delay circuit arranged to compensate for more delay being present in a first routing path between the output of the second switch circuit and the BIST circuit than in a second routing path between the output of the second switch circuit and the second memory,
   wherein the first delay circuit is arranged to cause the first test clock to be aligned when received into the BIST and the first memory and the second delay is arranged to cause the second test clock to be aligned when received into the BIST circuit and the second memory.

4. The device of claim 1, wherein the BIST circuit is arranged to use a same timing for testing the first memory as the timing for the first test clock that is received by the first memory during such testing of the first memory and the BIST circuit is arranged to use a same timing for testing the second memory as the timing for the second test clock that is received by the second memory during such testing of the second memory.

5. The device of claim 4, further comprising one or more delay circuits that are arranged to delay the test clock that is input to the first and second switching circuits during an automatic test pattern generation (ATPG) mode, wherein the BIST switch circuit is arranged to decouple a timing of the first and second test clocks from such one or more delay circuits during testing of the first or second memory by the BIST circuit during a BIST mode.

6. The device of claim 5, wherein the one or more delay circuits comprise a first delay circuit arranged to delay the test clock that is input to the first switching circuit and does not comprise a delay circuit for delaying the test clock that is input to the second switching circuit.

7. The device of claim 1, further comprising a clock selection circuit associated with the BIST circuit for generating a plurality of clock selection values for inputting to the BIST switching circuit, wherein the BIST switching circuit is arranged to receive one of the clock selection values as one or more inputs for selecting between the first and second test clock.

8. The device of claim 7, wherein the clock selection circuit comprises a plurality of scan registers for receiving input data for testing the first and second memory along with clock selection data for generating the plurality of inputs for selecting between the first and second test clock.

9. An integrated system on a chip (SOC), comprising:
   a plurality of memory arrays that are operable in a plurality of different clock domains corresponding to a plurality of different user mode clocks, wherein one or more of the memory arrays are operable in each different clock domain; wherein the different user mode clocks are receivable by their corresponding one or more memory arrays via a plurality of user mode paths having a plurality of associated delays;
   a plurality of programmed logic modules for implementing one or more functions, wherein one or more programmed logic modules are operable in each different clock domains;
   a built-in-self-test (BIST) module for testing each of the memory arrays using a test clock; and
   a clock selector arranged to select one of a plurality of selectable paths for the BIST module to receive the test clock for testing each memory array, wherein the selected path has a delay that is substantially equal to such memory array's associated delay of its user mode path.

10. The system of claim 9, wherein the BIST module is arranged to use a same timing for testing each memory as the timing for the test clock that is received by such memory during such testing of such memory.

11. A method of implementing a device, the method comprising:
    implementing a first memory that is operable to use a first normal mode clock having a first clock domain characteristic for a normal mode;
    implementing a second memory that is operable to use a second normal mode clock having a second clock domain characteristic for the normal mode, wherein the first clock domain characteristic differs from the second clock domain characteristic;
    implementing a first switching circuit that is arranged to receive the first normal mode clock and an initial test clock and to selectively output to the first memory either the first normal mode clock when the normal mode is selected or the initial test clock as a first test clock when a testing mode is selected;

implementing a second switching circuit that is arranged to receive the second normal mode clock and the initial test clock and to selectively output to the second memory either the second normal mode clock when the normal mode is selected or the initial test clock as a second test clock when the testing mode is selected;

implementing a built-in-self-test (BIST) switching circuit that is arranged to receive and output the first test clock when the first memory is being tested and to receive and output the second test clock when the second memory is being tested; and implementing a built-in-self-test (BIST) circuit that is arranged to receive and use the first test clock for testing the first memory and to receive and use the second test clock for testing the second memory.

12. The method of claim 11, wherein the BIST switching circuit is arranged so that:

a first delay associated with a first path between an output of the first switch circuit and the BIST circuit equals a delay associated with a second path between the output of the first switch circuit and the first memory so as to cause the first test clock to be aligned when received into the BIST circuit and the first memory, and a second delay associated with a first path between the output of the second switch circuit and the BIST circuit equals a delay associated with a second path between the output of the second switch circuit and the second memory so as to cause the second test clock to be aligned when received into the BIST circuit and the second memory.

13. The method of claim 11, further comprising:

implementing a first delay circuit arranged to compensate for more delay being present in a first routing path between the output of the first switch circuit and the BIST circuit than in a second routing path between the output of the first switch circuit and the first memory; and implementing a second delay circuit arranged to compensate for more delay being present in a first routing path between the output of the second switch circuit and the BIST circuit than in a second routing path between the output of the second switch circuit and the second memory, wherein the first delay circuit is arranged to cause the first test clock to be aligned when received into the BIST and the first memory and the second delay is arranged to cause the second test clock to be aligned when received into the BIST circuit and the second memory.

14. The method of claim 11, wherein the BIST circuit is arranged to use a same timing for testing the first memory as the timing for the first test clock that is received by the first memory during such testing of the first memory and the BIST circuit is arranged to use a same timing for testing the second memory as the timing for the second test clock that is received by the second memory during such testing of the second memory.

15. The method of claim 14, further comprising implementing one or more delay circuits that are arranged to delay the test clock that is input to the first and second switching circuits during an automatic test pattern generation (ATPG) mode, wherein the BIST switch circuit is arranged to decouple a timing of the first and second test clocks from such one or more delay circuits during testing of the first or second memory by the BIST circuit during a BIST mode.

16. The method of claim 15, wherein the one or more delay circuits comprise a first delay circuit arranged to delay the test clock that is input to the first switching circuit and does not comprise a delay circuit for delaying the test clock that is input to the second switching circuit.

17. The method of claim 11, further comprising implementing a clock selection circuit associated with the BIST circuit for generating a plurality of clock selection values for inputting to the BIST switching circuit, wherein the BIST switching circuit is arranged to receive one of the clock selection values as one or more inputs for selecting between the first and second test clock.

18. The method of claim 17, wherein the clock selection circuit comprises a plurality of scan registers for receiving input data for testing the first and second memory along with clock selection data for generating the plurality of inputs for selecting between the first and second test clock.

* * * * *